United States Patent

Sengoku

(10) Patent No.: US 9,319,178 B2
(45) Date of Patent: Apr. 19, 2016

(54) METHOD FOR USING ERROR CORRECTION CODES WITH N FACTORIAL OR CCI EXTENSION

(71) Applicant: QUALCOMM Incorporated, San Diego, CA (US)

(72) Inventor: Shoichiro Sengoku, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 118 days.

(21) Appl. No.: 14/214,285

(22) Filed: Mar. 14, 2014

(65) Prior Publication Data

US 2015/0263823 A1 Sep. 17, 2015

(51) Int. Cl.
| | | |
|---|---|---|
| H03M 13/00 | (2006.01) | |
| H04L 1/00 | (2006.01) | |
| H03M 13/05 | (2006.01) | |
| H03M 13/31 | (2006.01) | |

(52) U.S. Cl.
CPC ............ H04L 1/0041 (2013.01); H03M 13/05 (2013.01); H03M 13/31 (2013.01)

(58) Field of Classification Search
None
See application file for complete search history.

(56) References Cited

U.S. PATENT DOCUMENTS

| | | | |
|---|---|---|---|
| 7,694,204 B2 | 4/2010 | Schmidt et al. | |
| 2003/0165112 A1* | 9/2003 | Noda | H04L 1/0041 370/203 |
| 2009/0015446 A1 | 1/2009 | Coene et al. | |
| 2010/0215118 A1* | 8/2010 | Ware | H03M 5/16 375/295 |
| 2011/0115655 A1 | 5/2011 | Noda | |
| 2011/0196997 A1* | 8/2011 | Ruberg | H04L 29/10 710/71 |
| 2012/0075127 A1 | 3/2012 | Okada | |
| 2013/0275828 A1 | 10/2013 | Abbasfar | |
| 2013/0290813 A1 | 10/2013 | Ramamoorthy et al. | |
| 2014/0176800 A1* | 6/2014 | Hayashi | G09G 5/005 348/636 |

OTHER PUBLICATIONS

Draft MIPI Alliance Specification for Camera Serial Interface 2 (CSI-2), Version 1.01.00 Revision 0.04, Apr. 2009. Available at: http://wenku.baidu.com/view/07740ceb0975f46527d3e1ec.html?pn=.
International Search Report and Written Opinion—PCT/US2015/020531—ISA/EPO—Jul. 2, 2015 (140661WO).

* cited by examiner

*Primary Examiner* — April Y Blair
*Assistant Examiner* — Thien D Nguyen
(74) *Attorney, Agent, or Firm* — Loza & Loza, LLP

(57) ABSTRACT

System, methods and apparatus are described that facilitate transmission of data over a multi-wire data communications link, particularly between two devices within an electronic apparatus. A data payload may be converted to a set of transition numbers, the transition numbers may be converted to a sequence of symbols and an error correction code (ECC) may be calculated from symbols in the sequence of symbols. The ECC corresponds to the data payload and the ECC may be appended to the data payload such that the set of transition numbers includes transition numbers corresponding to the ECC. The sequence of symbols is then transmitted on a plurality of signal wires. Clock information is encoded in the sequence of symbols. The clock information may be encoded by ensuring that each pair of consecutive symbols in the sequence of symbols includes two symbols that produce different signaling states on the plurality of signal wires.

40 Claims, 18 Drawing Sheets

| Symbols | T11...T0 | Hex | Bits [19...0] |
|---|---|---|---|
| 0321_ 0321_ 0321 | 0000_0000_0000 | 00000 | 0000_0000_0000_0000_0000 |
| 0321_ 0321_ 032⓪ | 0000_0000_0002 | 00002 | 0000_0000_0000_0000_0010 |
| 0321_ 0321_ 032③ | 0000_0000_0001 | 00001 | 0000_0000_0000_0000_0001 |
| 0321_ 0321_ 03⓪1 | 0000_0000_0011 | 00004 | 0000_0000_0000_0000_0100 |
| 0321_ 0321_ 0①21 | 0000_0000_0110 | 0000C | 0000_0000_0000_0000_1100 |
| 0321_ 0321_ ②321 | 0000_0000_1100 | 00024 | 0000_0000_0000_0010_0100 |
| 0321_ 032③_ 0321 | 0000_0001_1000 | 0006C | 0000_0000_0000_0110_1100 |
| 0321_ 03⓪1_ 0321 | 0000_0011_0000 | 00144 | 0000_0000_0001_0100_0100 |
| 0321_ 0①21_ 0321 | 0000_0110_0000 | 003CC | 0000_0000_0011_1100_1100 |
| 0321_ ②321_ 0321 | 0000_1100_0000 | 00B64 | 0000_0000_1011_0110_0100 |
| 032③_ 0321_ 0321 | 0001_1000_0000 | 0222C | 0000_0010_0010_0010_1100 |
| 03⓪1_ 0321_ 0321 | 0011_0000_0000 | 06684 | 0000_0110_0110_1000_0100 |
| 0①21_ 0321_ 0321 | 0110_0000_0000 | 1338C | 0001_0011_0011_1000_1100 |
| ②321_ 0321_ 0321 | 1100_0000_0000 | 39AA4 | 0011_1001_1010_1010_0100 |

*FIG. 10*

METHOD FOR USING ERROR CORRECTION CODES WITH N FACTORIAL OR CCI EXTENSION

BACKGROUND

1. Field

The present disclosure relates generally to an interface between a host processor and a peripheral device such as a camera and, more particularly, to improving error correction processes on an N-factorial or camera control communication interface bus.

2. Background

Manufacturers of mobile devices, such as cellular phones, may obtain components of the mobile devices from various sources, including different manufacturers. For example, an application processor in a cellular phone may be obtained from a first manufacturer, while the display for the cellular phone may be obtained from a second manufacturer. The application processor and a display or other device may be interconnected using a standards-based or proprietary physical interface. For example, a display may provide an interface that conforms to the Display System Interface (DSI) standard specified by the Mobile Industry Processor Interface Alliance (MIPI).

In one example, a multi-signal data transfer system may employ multi-wire differential signaling such as 3-phase or N-factorial (N!) low-voltage differential signaling (LVDS), transcoding (e.g., the digital-to-digital data conversion of one encoding type to another) may be performed to embed symbol clock information by causing a symbol transition at every symbol cycle, instead of sending clock information in separate data lanes (differential transmission paths). Embedding clock information by transcoding is an effective way to minimize skew between clock and data signals, as well as to eliminate the necessity of a phase-locked loop (PLL) to recover the clock information from the data signals.

In another example, a camera control interface (CCI) defined by MIPI standards uses a two-wire, bi-directional, half duplex, serial interface configured as a bus connecting a master and one or more slaves. Conventional CCI is compatible with a protocol used in a variant of the Inter-Integrated Circuit (I2C) bus and is capable of handling multiple slaves on the bus, with a single master. The CCI bus may include Serial Clock (SCL) and Serial Data (SDA) lines. CCI devices and I2C devices can be deployed on the same bus such that two or more CCI devices may communicate using CCI protocols, while any communication involving an I2C bus uses I2C protocols. A CCI extension (CCIe) bus may be used to provide higher data rates for devices that are compatible with CCIe bus operations. Such devices may be referred to as CCIe devices, and the CCIe devices can attain higher data rates when communicating with each other by encoding data as symbols transmitted on both the SCL line and the SDA line of a conventional CCI bus.

There exists an ongoing need for optimized communications in general and improved reliability of data transfer on multi-signal wire communication links.

SUMMARY

Embodiments disclosed herein provide systems, methods and apparatus related to multi-wire interfaces. In an aspect of the disclosure, a method of data communications includes converting a data payload to a set of transition numbers, converting the set of transition numbers to a sequence of symbols, calculating an error correction code (ECC) from symbols in the sequence of symbols that correspond to the data payload, appending the ECC to the data payload such that the set of transition numbers includes transition numbers corresponding to the ECC, and transmitting the sequence of symbols on a plurality of signal wires.

In an aspect of the disclosure, converting the set of transition numbers to the sequence of symbols includes using a transition number to select a next symbol relative to a current symbol. A value of the transition number may represent a separation between the current symbol and the next symbol in a table of available symbols.

In an aspect of the disclosure, clock information is encoded in the sequence of symbols. The clock information may be encoded by ensuring that each pair of consecutive symbols in the sequence of symbols includes two symbols that produce different signaling states on the plurality of signal wires.

In an aspect of the disclosure, an error correction code may be calculated for each of a plurality of signals transmitted on the plurality of signal wires. The plurality of signals may correspond to the sequence of symbols. The error correction codes calculated for the plurality of signals may be appended to the data payload. Each of the plurality of signals may correspond to a bit in each symbol in the sequence of symbols.

In an aspect of the disclosure, the plurality of signal wires is provided in a CCIe bus. The data payload may include two CCIe words.

In an aspect of the disclosure, transmitting the sequence of symbols includes transmitting each symbol in the sequence of symbols on differential signals carried on different combinations of two signal wires selected from the plurality of signal wires. Each of the differential signals may correspond to a bit of each symbol. The ECC may be calculated by calculating an error correction code for each differential signal. In one example, error correction logic can correct one error in each differential signal for each sequence of symbols.

In an aspect of the disclosure, an apparatus for data communications includes means for converting a data payload to a set of transition numbers, means for converting the set of transition numbers to a sequence of symbols, means for calculating an ECC from symbols in the sequence of symbols that correspond to the data payload, means for appending the ECC to the data payload such that the set of transition numbers includes transition numbers corresponding to the ECC, and means for transmitting the sequence of symbols on a plurality of signal wires.

In an aspect of the disclosure, the means for converting the set of transition numbers is configured to encode clock information in the sequence of symbols by ensuring that each pair of consecutive symbols in the sequence of symbols includes two symbols that produce different signaling states on the plurality of signal wires.

In an aspect of the disclosure, a transmitter includes a plurality of line drivers configured to transmit a plurality of signals on an N wire interface and a processing circuit configured to convert a data payload to a set of transition numbers, convert the set of transition numbers to a sequence of symbols, calculate an ECC from symbols in the sequence of symbols that correspond to the data payload, append the ECC to the data payload such that the set of transition numbers includes transition numbers corresponding to the error correction code, and transmit the sequence of symbols on the plurality of signal wires.

In an aspect of the disclosure, a processor-readable storage medium has one or more instructions stored thereon. The instructions, when executed by a processing circuit, cause the processing circuit to convert a data payload to a set of transition numbers, convert the set of transition numbers to a sequence of symbols, calculate an ECC from symbols in the sequence of symbols that correspond to the data payload, append the ECC to the data payload such that the set of transition numbers includes transition numbers corresponding to the ECC, and transmit the sequence of symbols on a plurality of signal wires.

In an aspect of the disclosure, a method of data communications includes receiving a sequence of symbols from a plurality of signal wires, calculating a first ECC from a plurality of symbols in the sequence of symbols, the plurality of symbols corresponding to a data payload carried in the sequence of symbols, converting the sequence of symbols to a set of transition numbers, converting the set of transition numbers to obtain a data packet that includes the data payload and a second ECC, the second ECC having been calculated by a transmitter of the sequence of symbols, determining whether one or more errors are present in the sequence of symbols based on a comparison of the first ECC with the second ECC, and providing the data payload as receiver output data.

In an aspect of the disclosure, at least one error in the sequence of symbols is corrected using the first ECC and the second ECC. First ECCs and second ECCs calculated for different bits in a symbol and/or first ECCs and second ECCs calculated for different signals may be encoded and transmitted in the sequence of symbols. Accordingly, multiple errors may be corrected in the sequence of symbols. For example, a plurality of first and second ECCs can be used to correct multiple errors occurring in a sequence of symbols when two or more signals corresponding to different bits of the symbols each have a single error.

In an aspect of the disclosure, the sequence of symbols is converted to the set of transition numbers by deriving a transition number as a value that represents a separation between occurrences of a current symbol and an immediately preceding symbol in a table of available symbols.

In an aspect of the disclosure, a receive clock is extracted from the sequence of symbols. Clock information may be embedded in changes in signaling state associated with symbols in the sequence of symbols. Each pair of consecutive symbols in the sequence of symbols may include two symbols that are associated with different signaling states on the plurality of signal wires.

In an aspect of the disclosure, a plurality of first error correction codes may be calculated from the sequence of symbols. Each error correction code may correspond to a bit in each symbol of the sequence of symbols. It may be determined whether one or more errors are present in the sequence of symbols by comparing each of the plurality of first error correction codes with corresponding second error correction codes appended to the data packet. Errors in individual signals of a plurality of signals may be detected or corrected based on the comparison of the first error correction codes with corresponding second error correction codes. In one example, one error per signal per symbol per word can be corrected.

In an aspect of the disclosure, the plurality of signal wires is provided in a CCIe bus. The data payload may include two CCIe words.

In an aspect of the disclosure, each symbol in the sequence of symbols is received as a set of differential signals carried on different combinations of two signal wires selected from the plurality of signal wires. Each differential signal in the set of differential signals corresponds to a bit of the each symbol. The first ECC may be calculated by calculating an ECC for each differential signal.

In an aspect of the disclosure, an apparatus includes means for receiving a sequence of symbols from a plurality of signal wires, means for calculating a first ECC from a plurality of symbols in the sequence of symbols, the plurality of symbols corresponding to a data payload carried in the sequence of symbols, means for converting the sequence of symbols to a set of transition numbers, means for converting the set of transition numbers to obtain a data packet that includes the data payload and a second ECC, the second ECC having been calculated by a transmitter of the sequence of symbols, means for determining whether one or more errors are present in the sequence of symbols based on a comparison of the first ECC with the second ECC, and means for providing the data payload as receiver output data. In one example, one error per signal per symbol per word can be corrected.

In an aspect of the disclosure, the apparatus includes means for extracting a receive clock from the sequence of symbols. Clock information may be embedded in changes in signaling state associated with symbols in the sequence of symbols. Each pair of consecutive symbols in the sequence of symbols may include two symbols that are associated with different signaling states on the plurality of signal wires.

In an aspect of the disclosure, a receiver includes a processing circuit configured to receive a sequence of symbols from a plurality of signal wires, calculate a first ECC from a plurality of symbols in the sequence of symbols, the plurality of symbols corresponding to a data payload carried in the sequence of symbols, convert the sequence of symbols to a set of transition numbers, convert the set of transition numbers to obtain a data packet that includes the data payload and a second ECC, the second ECC having been calculated by a transmitter of the sequence of symbols, determine whether one or more errors are present in the sequence of symbols based on a comparison of the first ECC with the second ECC, and provide the data payload as receiver output data.

In an aspect of the disclosure, a processor-readable storage medium has one or more instructions stored or maintained thereon. The instructions, when executed by at least one processing circuit, may cause the at least one processing circuit to receive a sequence of symbols from a plurality of signal wires, calculate a first ECC from a plurality of symbols in the sequence of symbols, the plurality of symbols corresponding to a data payload carried in the sequence of symbols, convert the sequence of symbols to a set of transition numbers, convert the set of transition numbers to obtain a data packet that includes the data payload and a second ECC, the second ECC having been calculated by a transmitter of the sequence of symbols, determine whether one or more errors are present in the sequence of symbols based on a comparison of the first ECC with the second ECC, and provide the data payload as receiver output data.

BRIEF DESCRIPTION OF THE DRAWINGS

FIG. 10 is a table illustrating the effect of single symbol errors in a CCIe system that uses an encoding scheme similar to that illustrated in FIG. 9.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Certain aspects of the invention may be applicable to communications links deployed between electronic devices that are subcomponents of a mobile apparatus such as a telephone, a mobile computing device, an appliance, automobile electronics, avionics systems, etc. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, a wearable computing device (e.g., a smartwatch, a health or fitness tracker, etc.), an appliance, a sensor, a vending machine, or any other similar functioning device.

Figure 1:
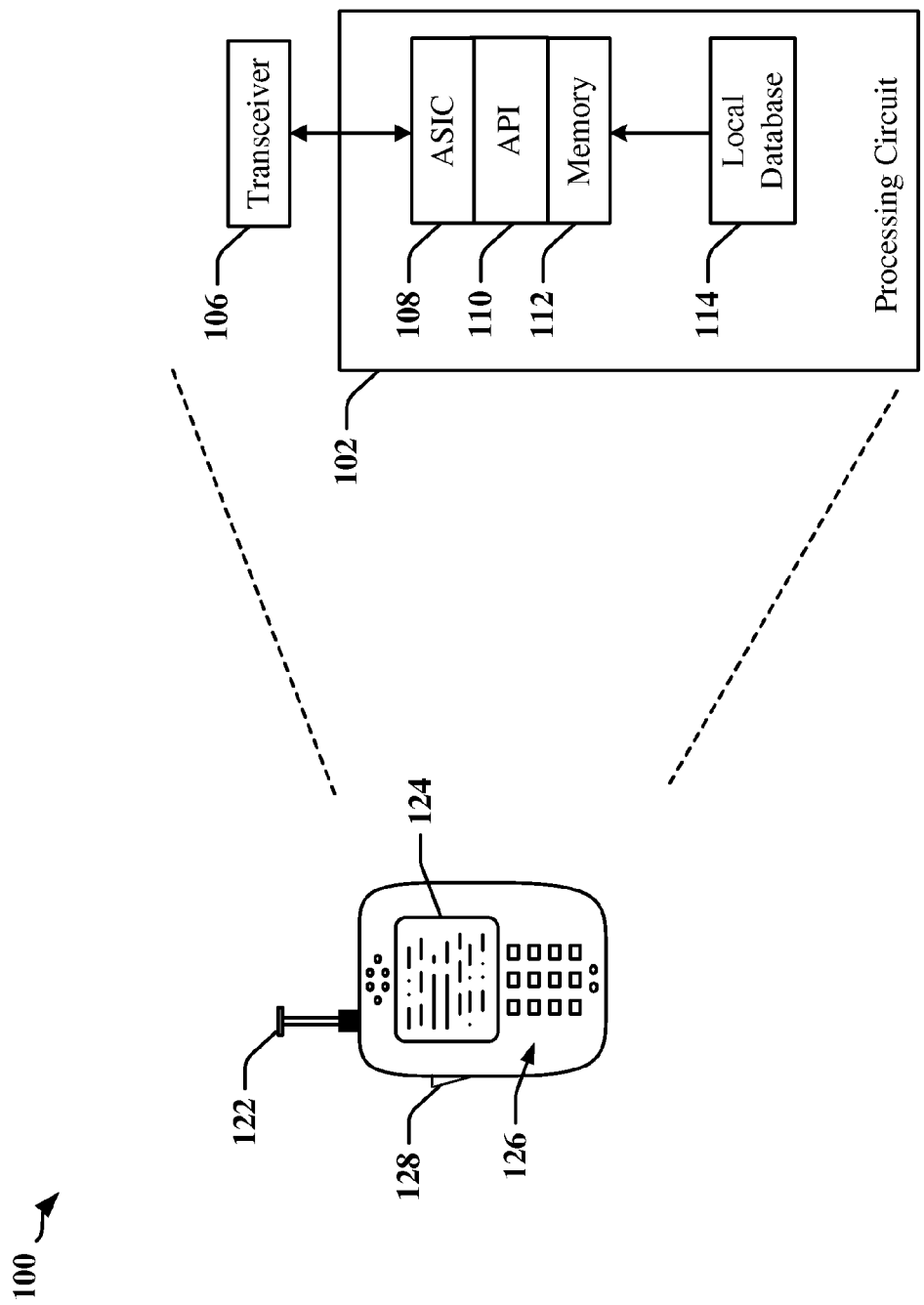
FIG. 1 depicts an apparatus employing a data link between IC devices that selectively operates according to one of plurality of available standards.

FIG. 1 depicts one example of an apparatus 100 that employs a communication link between IC devices. In one example, the apparatus 100 may include a wireless communication device that communicates through an RF transceiver with a radio access network (RAN), a core access network, the Internet and/or another network. The apparatus 100 may include a communications transceiver 106 operably coupled to processing circuit 102. The processing circuit 102 may include one or more IC devices, such as an application-specific IC (ASIC) 108. The ASIC 108 may include one or more processing devices, logic circuits, and so on. The processing circuit 102 may include and/or be coupled to processor readable storage such as a memory 112 that may maintain instructions and data that may be executed by processing circuit 102. The processing circuit 102 may be controlled by one or more of an operating system and an application programming interface (API) 110 layer that supports and enables execution of software modules residing in storage media, such as the memory device 112 of the wireless device. The memory device 112 may include read-only memory (ROM) or random-access memory (RAM), electrically erasable programmable ROM (EEPROM), flash cards, or any memory device that can be used in processing systems and computing platforms. The processing circuit 102 may include or access a local database 114 that can maintain operational parameters and other information used to configure and operate the apparatus 100. The local database 114 may be implemented using one or more of a database module, flash memory, magnetic media, EEPROM, optical media, tape, soft or hard disk, or the like. The processing circuit may also be operably coupled to external devices such as an antenna 122, a display 124, operator controls, such as button 128 and keypad 126 among other components.

Figure 2:
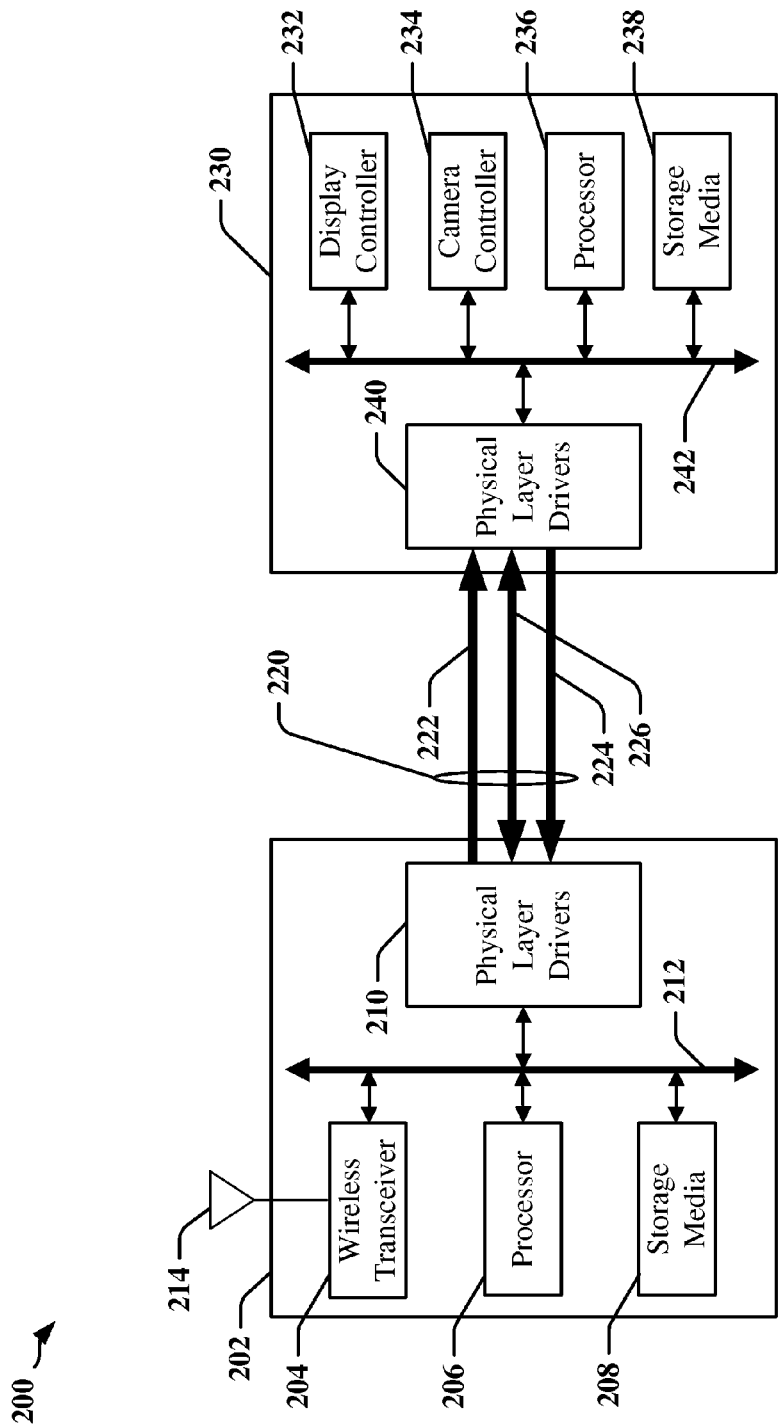
FIG. 2 illustrates a system architecture for an apparatus employing a data link between IC devices.

FIG. 2 is a block schematic drawing illustrating certain aspects of an apparatus 200 connected to a communication link 220, where the apparatus 200 may be embodied in one or more of a wireless mobile device, a mobile telephone, a mobile computing system, a wireless telephone, a notebook computer, a tablet computing device, a media player, s gaming device, or the like. The apparatus 200 may include a plurality of IC devices 202 and 230 that exchange data and control information through a communication link 220. The communication link 220 may be used to connect IC devices 202 and 222 that are located in close proximity to one another, or physically located in different parts of the apparatus 200. In one example, the communication link 220 may be provided on a chip carrier, substrate or circuit board that carries the IC devices 202 and 230. In another example, a first IC device 202 may be located in a keypad section of a flip-phone while a second IC device 230 may be located in a display section of the flip-phone. In another example, a portion of the communication link 220 may include a cable or optical connection.

The communication link 220 may include multiple channels 222, 224 and 226. One or more channels 226 may be bidirectional, and may operate in half-duplex and/or full-duplex modes. One or more channels 222 and 224 may be unidirectional. The communication link 220 may be asymmetrical, providing higher bandwidth in one direction. In one example described herein, a first communications channel 222 may be referred to as a forward link 222 while a second communications channel 224 may be referred to as a reverse link 224. The first IC device 202 may be designated as a host system or transmitter, while the second IC device 230 may be designated as a client system or receiver, even if both IC devices 202 and 230 are configured to transmit and receive on the communications link 222. In one example, the forward link 222 may operate at a higher data rate when communicating data from a first IC device 202 to a second IC device 230, while the reverse link 224 may operate at a lower data rate when communicating data from the second IC device 230 to the first IC device 202.

The IC devices 202 and 230 may each have a processor or other processing and/or computing circuit or device 206, 236. In one example, the first IC device 202 may perform core functions of the apparatus 200, including maintaining wireless communications through a wireless transceiver 204 and an antenna 214, while the second IC device 230 may support a user interface that manages or operates a display controller 232. The first IC device 202 or second IC device 230 may control operations of a camera or video input device using a camera controller 234. Other features supported by one or more of the IC devices 202 and 230 may include a keyboard, a voice-recognition component, and other input or output devices. The display controller 232 may include circuits and software drivers that support displays such as a liquid crystal display (LCD) panel, touch-screen display, indicators and so on. The storage media 208 and 238 may include transitory and/or non-transitory storage devices adapted to maintain instructions and data used by respective processors 206 and 236, and/or other components of the IC devices 202 and 230. Communication between each processor 206, 236 and its corresponding storage media 208 and 238 and other modules and circuits may be facilitated by one or more bus 212 and 242, respectively.

The reverse link 224 may be operated in the same manner as the forward link 222, and the forward link 222 and reverse link 224 may be capable of transmitting at comparable speeds or at different speeds, where speed may be expressed as data transfer rate and/or clocking rates. The forward and reverse data rates may be substantially the same or differ by orders of magnitude, depending on the application. In some applications, a single bidirectional link 226 may support communications between the first IC device 202 and the second IC device 230. The forward link 222 and/or reverse link 224 may be configurable to operate in a bidirectional mode when, for example, the forward and reverse links 222 and 224 share the same physical connections and operate in a half-duplex manner. In one example, the communication link 220 may be operated to communicate control, command and other information between the first IC device 202 and the second IC device 230 in accordance with an industry or other standard.

In one example, forward and reverse links 222 and 224 may be configured or adapted to support a wide video graphics array (WVGA) 80 frames per second LCD driver IC without a frame buffer, delivering pixel data at 810 Mbps for display refresh. In another example, forward and reverse links 222 and 224 may be configured or adapted to enable communications between with dynamic random access memory (DRAM), such as double data rate synchronous dynamic random access memory (SDRAM). Encoding devices 210 and/or 230 can encode multiple bits per clock transition, and multiple sets of wires can be used to transmit and receive data from the SDRAM, control signals, address signals, and so on.

The forward and reverse links 222 and 224 may comply or be compatible with application-specific industry standards. In one example, the MIPI standard defines physical layer interfaces between an application processor IC device 202 and an IC device 230 that supports the camera or display in a mobile device. The MIPI standard includes specifications that govern the operational characteristics of products that comply with MIPI specifications for mobile devices. The MIPI standard may define interfaces that employ complimentary metal-oxide-semiconductor (CMOS) parallel busses.

In one example, the communication link 220 of FIG. 2 may be implemented as a wired bus that includes a plurality of signal wires (denoted as N wires). The N wires may be configured to carry data encoded in symbols, where clock information is embedded in a sequence of the symbols transmitted over the plurality of wires.

Figure 3:
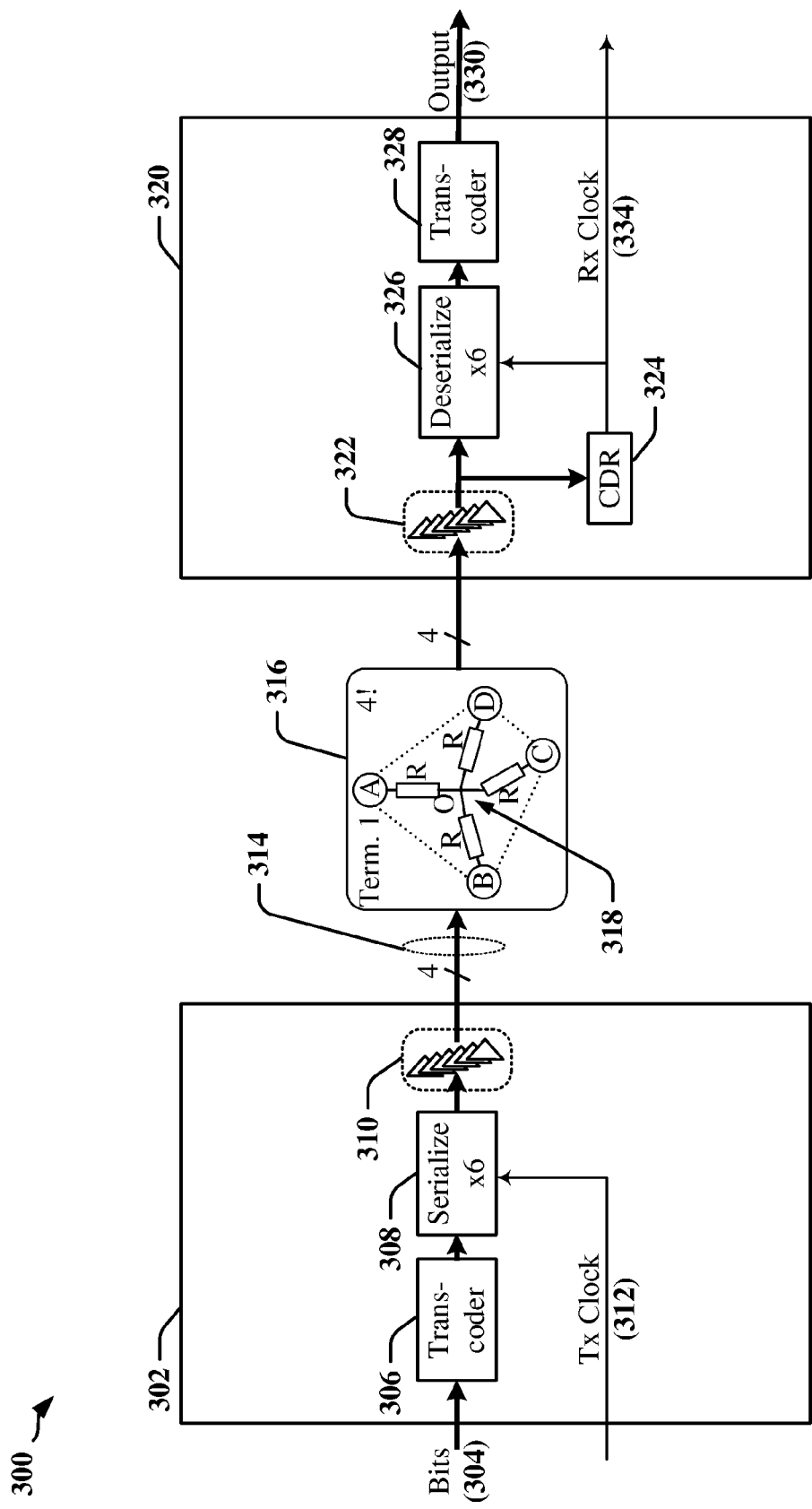
FIG. 3 illustrates an example of a basic N! multi-lane interface.

FIG. 3 is a diagram illustrating one example of an N-wire interface 300 provided between two devices 302 and 332. At a transmitter 302, a transcoder 306 may be used to encode data 304 and clock information in symbols to be transmitted over a set of N wires 314 using N-factorial (N!) encoding. The clock information is derived from a transmit clock 312 and may be encoded in a sequence of symbols transmitted in $_NC_2$ differential signals over the N wires 314 by ensuring that a signaling state transition occurs on at least one of the $_NC_2$ signals between consecutive symbols. When N! encoding is used to drive the N wires 314, each bit of a symbol is transmitted as a differential signal by one of a set of differential line drivers 310, where the differential drivers in the set of line drivers 310 are coupled to different pairs of the N wires. The number of available combinations of wire pairs ($_NC_2$) determines the number of signals that can be transmitted over the N wires 314. The number of data bits 304 that can be encoded in a symbol may be calculated based on the number of available signaling states available for each symbol transmission interval.

A termination impedance (typically resistive) couples each of the N wires 314 to a common center point 318 in a termination network 316. It will be appreciated that the signaling states of the N wires 314 reflects a combination of the currents in the termination network 316 attributed to the differential drivers 310 coupled to each wire. It will be further appreciated that the center point 318 is a null point, whereby the currents in the termination network 316 cancel each other at the center point.

The N! encoding scheme need not use a separate clock channel and/or non-return-to-zero decoding because at least one of the $_NC_2$ signals in the link transitions between consecutive symbols. Effectively, the transcoder 306 ensures that a transition occurs between each pair of symbols transmitted on the N wires 314 by producing a sequence of symbols in which each symbol is different from its immediate predecessor symbol. In the example depicted in FIG. 3, N=4 wires are provided, and the 4 wires can carry $_4C_2=6$ differential signals. The transcoder 306 may employ a mapping scheme to generate raw symbols for transmission on the N wires 314. The transcoder 306 may map data bits 304 to a set of transition numbers. The transition numbers may then be used to select a raw symbol for transmission based on the value of the preceding symbol such that the selected raw symbol is different from the preceding raw symbol. In one example, a transition number may be used to lookup a data value corresponding to the second of the consecutive raw symbols with reference to the first of the consecutive raw symbols. At the receiving device 320, a transcoder 328 may employ a mapping to determine a transition number that characterizes a difference between a pair of consecutive raw symbols in a lookup table, for example. The transcoders 306, 328 operate on the basis that every consecutive pair of raw symbols includes two different symbols.

The transcoder 306 at the transmitter 302 may select between the N!−1 symbols that are available at every symbol transition. In one example, a 4! system provides 4!−1=23 signaling states for the next symbol to be transmitted at each symbol transition. The bit rate may be calculated as $\log_2$ (available_states) per transmit clock cycle. In a system using double data rate (DDR) clocking, whereby symbol transitions occur at both the rising edge and falling edge of the transmit clock 312, two symbols are transmitted per transmit clock cycle. The total available states in the transmit clock cycle is $(_NC_2-1)^2=(23)^2=529$ and the number of data bits 304 that can transmitted per symbol may be calculated as $\log_2(529)=9.047$ bits.

A receiving device 320 receives the sequence of symbols using a set of line receivers 322 where each receiver in the set of line receivers 322 determines differences in signaling states on one pair of the N wires 314. Accordingly, $_NC_2$ receivers are used, where N represents the number of wires. The $_NC_2$ receivers 322 produce a corresponding number of raw symbols as outputs. In the depicted N=4 wire example, the signals received on the four wires 314 are processed by 6 receivers ($_4C_2=6$) to produce a state transition signal that is provided to a corresponding CDR 324 and deserializer 326. The CDR 324 may produce a receive clock signal 334 that can be used by the deserializer 326. The receive clock signal 334 may be a DDR clock signal that can be used by external circuitry to receive data provided by the transcoder 328. The transcoder 328 decodes a block of received symbols from the deserializer 326 by comparing each next symbol to its immediate predecessor. The transcoder 328 produces output data 330 corresponding to the data 304, provided to the transmitter 302.

Figure 4:
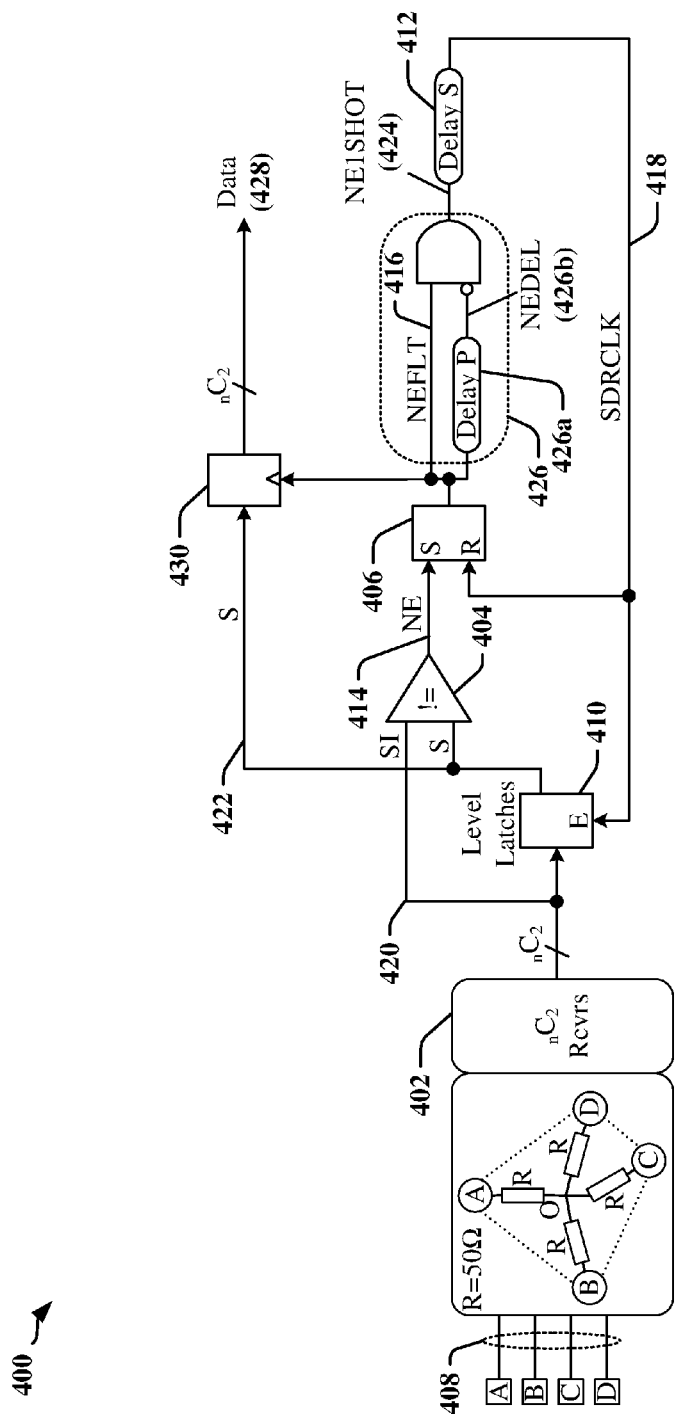
FIG. 4 illustrates a CDR circuit that may be used in an N! communication interface.
Figure 5:
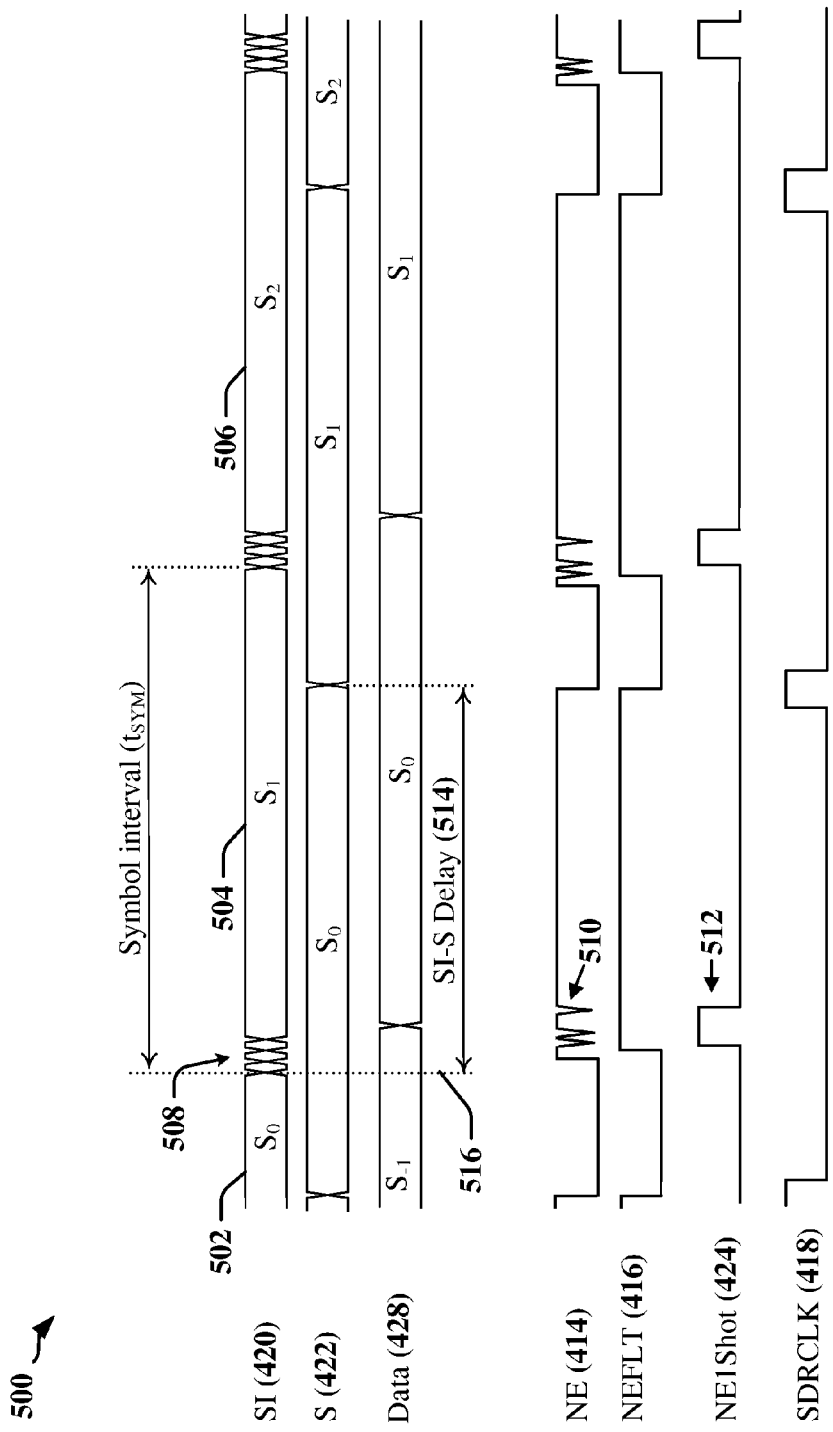
FIG. 5 illustrates timing of certain signals generated by the CDR circuit of FIG. 3 in accordance with one or more aspects disclosed herein.

FIG. 4 illustrates an example of a CDR circuit 400 that may be employed to recover embedded clock information in an N-wire system using N! encoding. The depicted CDR circuit 400 may be adapted for use with other encoding techniques and certain of the principles described herein relate also to CCIe interfaces, for example. FIG. 5 is a timing diagram illustrating certain signals generated through the operation of the CDR circuit 400. The CDR circuit 400

In an N! interface, signals received from N-wires 408 are initially processed by a number ($_NC_2$) of receivers 402, which produce a corresponding number of raw signals as outputs. In the illustrated example, N=4 wires 408 are processed by $_4C_2=6$ receivers 402 that produce a first state transition signal (SI signal) 420 that includes 6 raw signals representative of the received symbol. For each raw signal output from each different receiver there may be a setup time provided between symbols $S_0$ 502, $S_1$ 504 and $S_2$ 506 during which the state of the corresponding signal is undefined, indeterminate, transient or otherwise unstable. Level latches 410, a comparator 404, set-reset latch 406, a one-shot circuit 426, an analog delay element 412 and (bused) level latches 410 may be configured to generate a level-latched signal (S signal) 422 representative of a delayed instance of the SI signal 420, where the delay before the SI signal 420 is captured by the level latches to provide an updated S signal 422 may be selected by configuring a delay element (Delay S) 412.

In operation, the comparator 404 compares the SI signal 420 with the S signal 422 and outputs a binary comparison signal (NE signal) 414. The set-reset latch 406 may receive the NE signal 414 from the comparator 404 and output a signal (NEFLT signal) 416, which is a filtered version of the NE signal 414. The operation of the set-reset latch 406 can be configured to remove any transient instability in the NE signal 414, where the transient instability is exhibited as spikes 510 in the NE signal 414. The NEFLT signal 416 can be used to control the output latches 430 that capture the S signal 422 as output data signal 428.

The one-shot circuit 426 receives the NEFLT signal 416 and produces a fixed width pulse 512, which may then be delayed by the delay element 412 to produce a clock signal (SDRCLK) 418. In some instances, the SDRCLK signal 418 may be used by external circuitry to sample the data output 428 of the CDR 400. In one example, the SDRCLK signal 418 may be provided to decoder or deserializer circuits. The level latches 410 receive the SI signal 420 and output the S signal 422, where the level latches 410 are triggered or otherwise controlled by the SDRCLK signal 418.

In operation, the comparator 404 compares the SI signal 420 with the S signal 422, which is output from the level latches 410. The comparator 404 drives the NE signal 414 to a first state (e.g. logic low) when the SI signal 420 and the S signal 422 are equal, and to a second state (e.g. logic high) when the SI signal 420 and the S signal 422 are not equal. The NE signal 414 is in the second state when the SI signal 420 and the S signal 422 are representative of different symbols. Thus, the second state indicates that a transition is occurring.

As can be appreciated from the timing diagram 500, the S signal 422 is essentially a delayed and filtered version of SI signal 420, in which transients or glitches 508 have been removed because of the delay 514 between the SI signal 420 and the S signal 422. Multiple transitions 508 in the SI signal 420 may be reflected as spikes 510 in the NE signal 414, but these spikes 510 are masked from the NEFLT signal 416 through the operation of the set-reset circuit. Moreover, the SDRCLK 418 is resistant to line skew and glitches in the symbol transitions based on the use of the delays 426a, 412 provided in the feedback path to the level-latch 410 and set-reset circuit 406, whereby the SDRCLK signal 418 controls the reset function of the set-reset circuit 406.

At the commencement 516 of a transition between a first symbol value $S_0$ 502 and a next symbol value $S_1$ 504, the SI signal 420 begins to change state. The state of the SI signal 420 may be different from $S_1$ 504 due to the possibility that intermediate or indeterminate states 508 during the transition between $S_0$ 502 and $S_1$ 504. These intermediate or indeterminate states 508 may be caused, for example, by inter-wire skew, over/under shoot, cross-talk, etc.

The NE signal 414 becomes high as soon as the comparator 404 detects a difference in values between the SI signal 420 and the S signal 422, and the transition high of the NE signal 414 asynchronously sets the set-reset latch 406 output, driving the NEFLT signal 416 high. The NEFLT signal 416 is maintained in its high state until the set-reset latch 406 is reset by a high state of the SDRCLK signal 418. The SDRCLK signal 418 is a delayed version of the NE1SHOT signal 424, which is a limited pulse-width version of the NEFLT signal 416. The SDRCLK signal 418 may be delayed with respect to the NE1SHOT signal 424 through the use of the analog delay circuit 412, for example.

The intermediate or indeterminate states 508 on SI 420 may represent invalid data. These intermediate or indeterminate states 508 may contain a short period of the previous symbol value $S_0$ 502, and may cause the NE signal 414 to return low for short periods of time. Transitions of the SI signal 420 may generate spikes 510 on the NE signal 414. The spikes 510 are effectively filtered out and do not appear in the NEFLT signal 416.

The high state of the NEFLT signal 416 causes the SDRCLK signal 418 to transition high after a delay period 440 caused by the delay circuit 412. The high state of SDRCLK signal 418 resets the set-reset latch 406 output, causing the NEFLT signal 416 to transition to a low state. The high state of the SDRCLK signal 418 also enables the level latches 410, and the SI signal 420 value may be output on the S signal 422.

The comparator 404 detects that the S signal 422 (for symbol $S_1$ 502) matches the symbol $S_1$ 502 value present on the SI signal 420 and switches its output (the NE signal 414) low. The low state of the NEFLT signal 416 causes the SDRCLK signal 418 to go low after a delay period 442 caused by the analog delay 412. This cycle repeats for each transition in the SI signal 420. At a time after the falling edge of the SDRCLK signal 418, a new symbol $S_2$ 506 may be received and may cause the SI signal 420 to switch its value in accordance with the next symbol $S_2$ 506.

Figure 6:
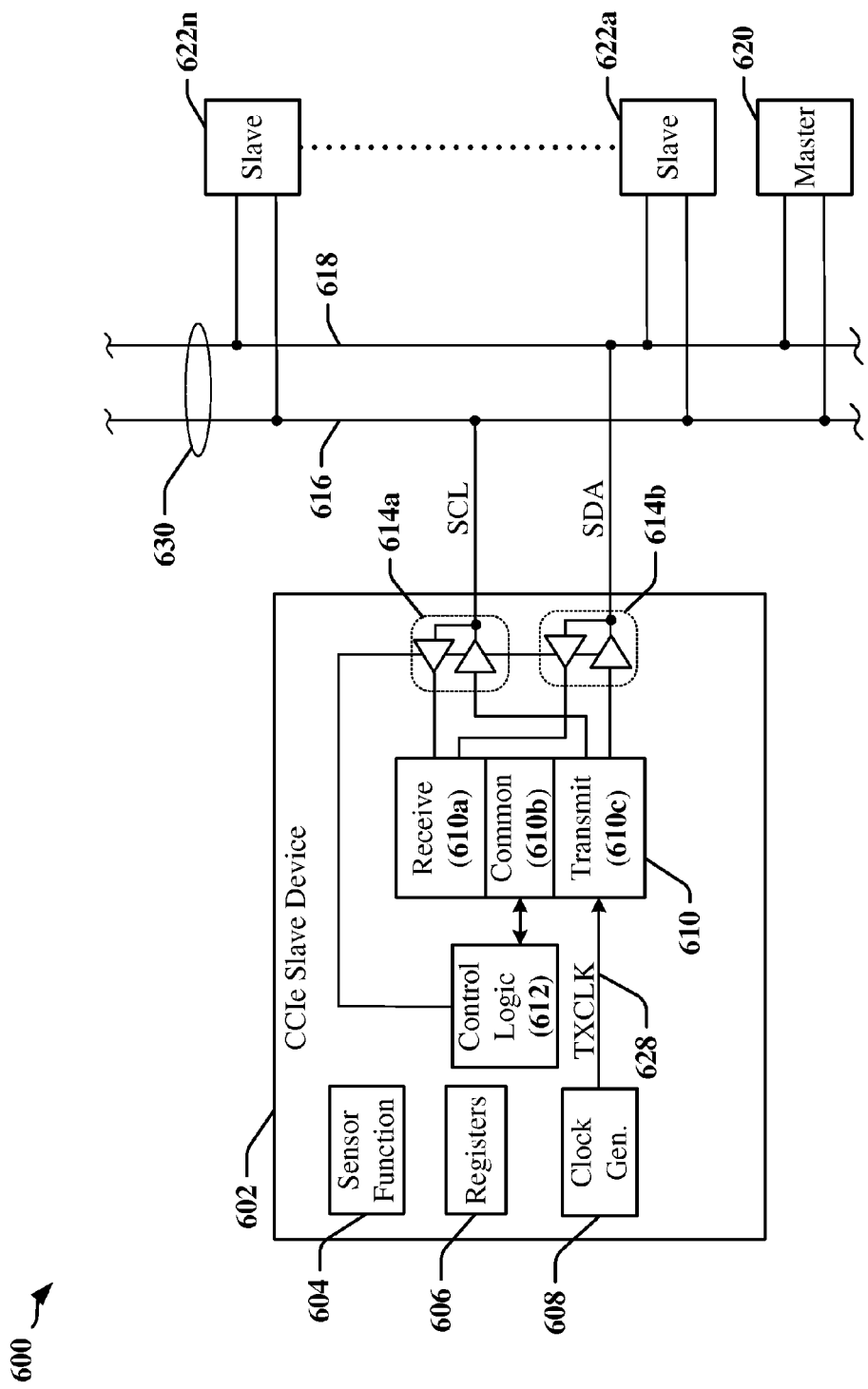
FIG. 6 illustrates an example of an apparatus employing a CCIe data link.

FIG. 6 is a block schematic diagram illustrating certain aspects of an apparatus 600 that employs a communications bus 630 configured for CCIe operation. The apparatus 600 may include multiple devices 602, 620 and 622a-622n, which communicate using the CCIe bus 630. In one example, an imaging device 602 is configured to operate as a slave device on the CCIe bus 630. The imaging device 602 may be adapted to provide a control function 604 that manages an image sensor, for example. In addition, the imaging device 602 may include configuration registers or other storage 606, control logic 612, a transceiver 610 and line drivers/receivers 614a and 614b. The control logic 612 may include a processing circuit such as a state machine, sequencer, signal processor or general-purpose processor.

The transceiver 610 may include a receiver 610a, a transmitter 610c and common circuits 610b, including timing, logic and storage circuits and/or devices. In one example, the transmitter 610c encodes and transmits data based on timing provided by a clock generation circuit 608. A conventional imaging device 604 may not have access to a clock that has a high enough frequency to permit the device 602 to achieve the indicated bit rate of the CCIe bus 630, because sensor devices 602 typically do not need or use a 125 MHz or higher clock. According to certain aspects disclosed herein, however, a receiver 610a may be configured or adapted to extract a receive clock from the CCIe bus by generating a clock signal directly from the received transmission using analog delay circuits that can eliminate the need for a high frequency clock and thereby conserve power during idle periods.

Figure 7:
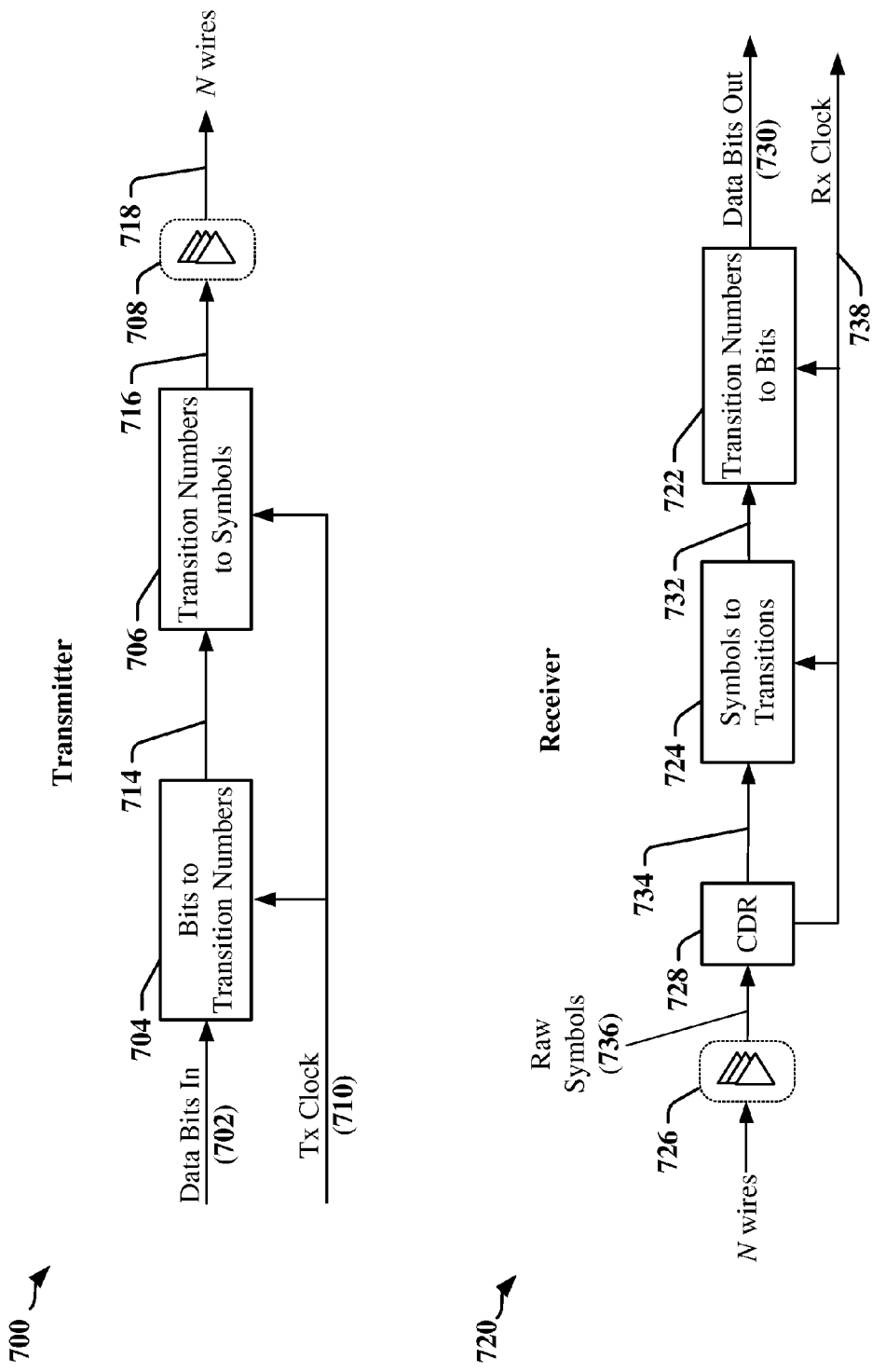
FIG. 7 illustrates the operation of a multi-wire interface in which clock information is embedded in a sequence of symbols transmitted over N wires.

FIG. 7 is a simplified block diagram illustrating a transmitter 700 and a receiver 720 configured according to certain aspects disclosed herein. The transmitter 700 and receiver 720 may be adapted for use with a variety of encoding techniques, including N! and CCIe. The transmitter 700 includes a first convertor 704 configured to convert data 702 into transition numbers 714. The transition numbers 714 may be used to select a next symbol for transmission based on the value of a current symbol, where the next symbol is different from a current symbol. A second converter 706 receives the transition numbers and produces a sequence of symbols for transmission on the interface using suitably configured line drivers 708. Since no pair of consecutive symbols includes two identical symbols, a transition of signaling state occurs in at least one of the signal wires 718 of the interface at every symbol transition. At the receiver 720, a set of line receivers 726 provides raw symbols (SI) 736 to a CDR 728 that extracts a receive clock 738 and provides captured symbols (S) 734 to a circuit that converts the captured symbols 734 to transition numbers 732. The transition numbers may be decoded by a circuit 722 to provide output data 730.

In the example of a CCIe system, the transmitter 700 may be configured or adapted to transcode data 710 into ternary (base-3) transition numbers 714. The ternary transition numbers 714 may be encoded in a sequence of symbols 716 to be transmitted on the signal wires 718, which may correspond to the SCL 616 and SDA 618 wires illustrated in FIG. 6. Each data element of the input data 702 may include 20-bit words. A transcoder 704 may receive the input data 702 and produce a sequence of ternary transition numbers 714 for each data element. The ternary transition numbers 714 may be encoded in two bits and there may be 12 ternary transition numbers 714 in each ternary sequence 712. An encoder 706 produces a stream of 2-bit symbols 716 that are transmitted through line drivers 708. In one example, the line drivers 708 may include open-drain output transistors. In another example, the line drivers 708 may include push-pull drivers. The output stream of 2-bit symbols 716 generated by the encoder has a transition in the state of at least one of the signal wires 718 between each pair of consecutive symbols 716 by ensuring that no pair of consecutive symbols include two identical symbols. The availability of a transition of state in at least one of the signal wires permits a receiving circuit 720 to extract a receive clock 738 from the stream of data symbols 716.

In a CCIe system, the receiver 720 includes line interface circuits 726 that provide a stream of raw 2-bit symbols 736 to a CDR 728. The CDR 728 extracts a receive clock 738 from the raw symbols 736 and provides a stream of 2-bit symbols 734 and the receive clock 738 to other circuits 722 and 724 of the receiver 720. In some instances, the CDR 728 may produce multiple clocks in its output 738. A decoder 724 may use the receive clock 738 to decode the stream of symbols 734 into sequences of 12 ternary transition numbers 732. The ternary transition numbers 732 may be encoded using two bits. A transcoder 722 may then convert each sequence of 12 ternary transition numbers 732 into 20-bit output data elements 730.

Figure 8:
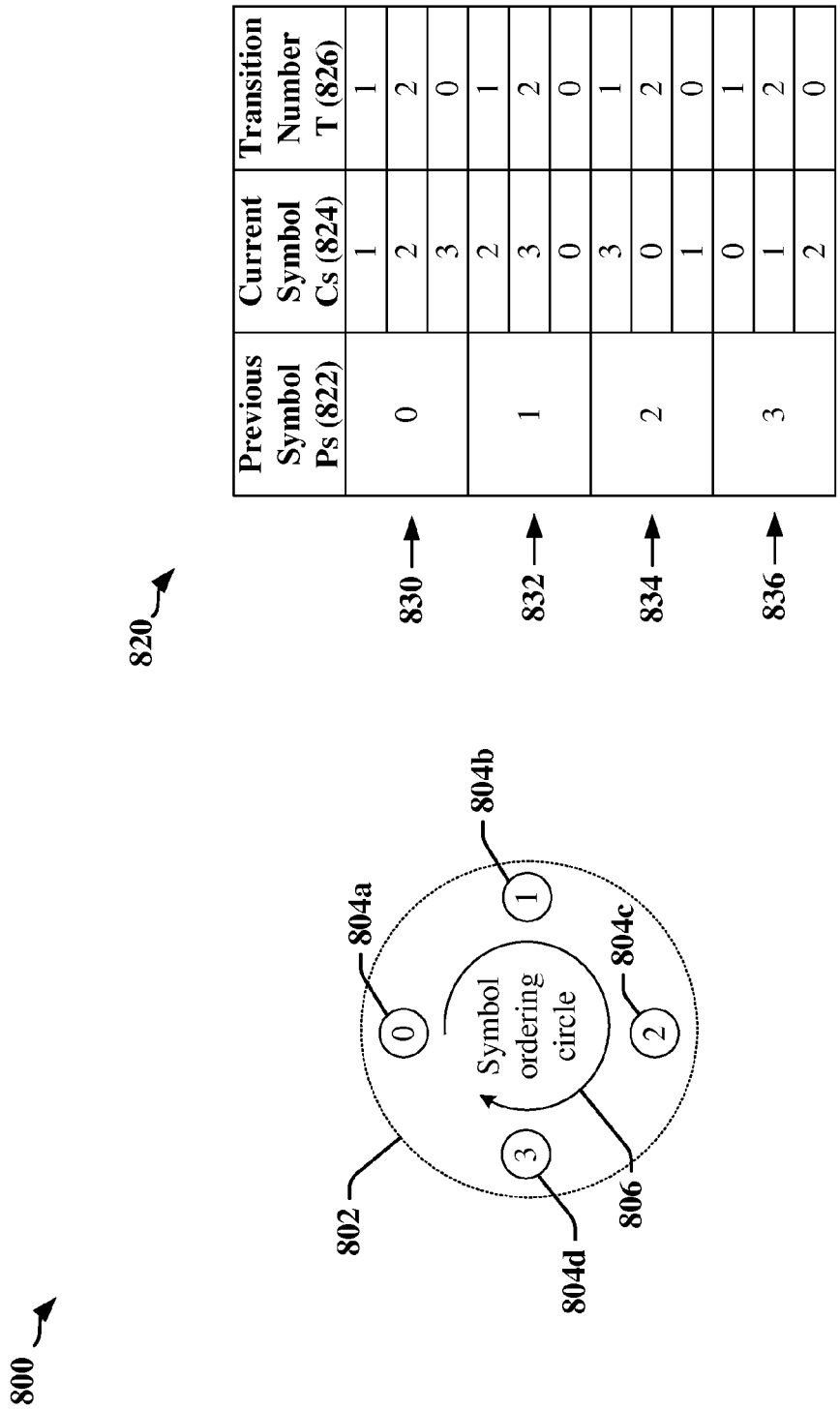
FIG. 8 illustrates an encoding scheme for transcoding data according to certain aspects disclosed herein.

FIG. 8 is a drawing illustrating an encoding scheme 800 used by a transcoder 704 configured to produce a sequence of symbols 716 for transmission on a CCIe interface. The encoding scheme 800 is provided by way of example and is also used by a transcoder 724 to extract data from symbols received from the signal wires 718 of the CCIe bus. In the CCIe encoding scheme 800, the two wires of the signal wires 718 of the CCIe bus permit definition of 4 basic symbols S: {0, 1, 2, 3}. Any two consecutive symbols in the sequence of symbols 716, 734 have different states, and the symbol sequences 0,0, 1,1, 2,2 and 3,3 are invalid combinations of consecutive symbols. Accordingly, only 3 valid symbol transitions are available at each symbol boundary, where the symbol boundary is determined by the transmit clock and represents the point at which a first symbol (previous symbol Ps) 822 terminates and a second symbol (current symbol Cs) 824 begins.

According to certain aspects disclosed herein, the three available transitions are assigned a transition number (T) 826 for each Ps symbol 822. The value of T 826 can be represented by a ternary number. In one example, the value of transition number 826 is determined by assigning a symbol-ordering circle 802 for the encoding scheme. The symbol-ordering circle 802 allocates locations 804a-804d on the circle 802 for the four possible symbols, and a direction of rotation 806 between the locations 804a-804d. In the depicted example, the direction of rotation 806 is clockwise. The transition number 826 may represent the separation between the valid current symbols 824 and the immediately preceding symbol 822. Separation may be defined as the number of steps along the direction of rotation 806 on the symbol-ordering circle 802 required to reach the current symbol Cs 824 from the previous symbol 822. The number of steps can be expressed as a single digit base-3 number. It will be appreciated that a three-step difference between symbols can be represented as a $0_{base-3}$. The table 820 in FIG. 8 summarizes an encoding scheme employing this approach.

At the transmitter 700, the table 820 may be used to lookup a current symbol 824 to be transmitted, given knowledge of the previously generated symbol 822 and an input ternary number, which is used as a transition number 826. At the receiver 720, the table 820 may be used as a lookup to determine a transition number 826 that represents the transition between the previously received symbol 822 and the currently received symbol 824. The transition number 826 may be output as a ternary number.

The use of a transcoder that embeds clock information in a sequence of symbols can disassociate data 702 received by a transmitter 700 from the sequence of symbols 716 transmitted on signal wires 718. Consequently, a received raw symbol 736 cannot be decoded to obtain a corresponding transmission data bits 702 without consideration of at least one previously transmitted symbol. This disassociation can render conventional error correction techniques ineffective. For example, a conventional system may append an error correction code (ECC) to data 702, where the ECC is calculated from a predefined block size of input data 702 or a packet length. The ECC may be used to identify and/or correct occurrences of errors during transmission, where the errors may include one or more bit errors.

Figure 9:
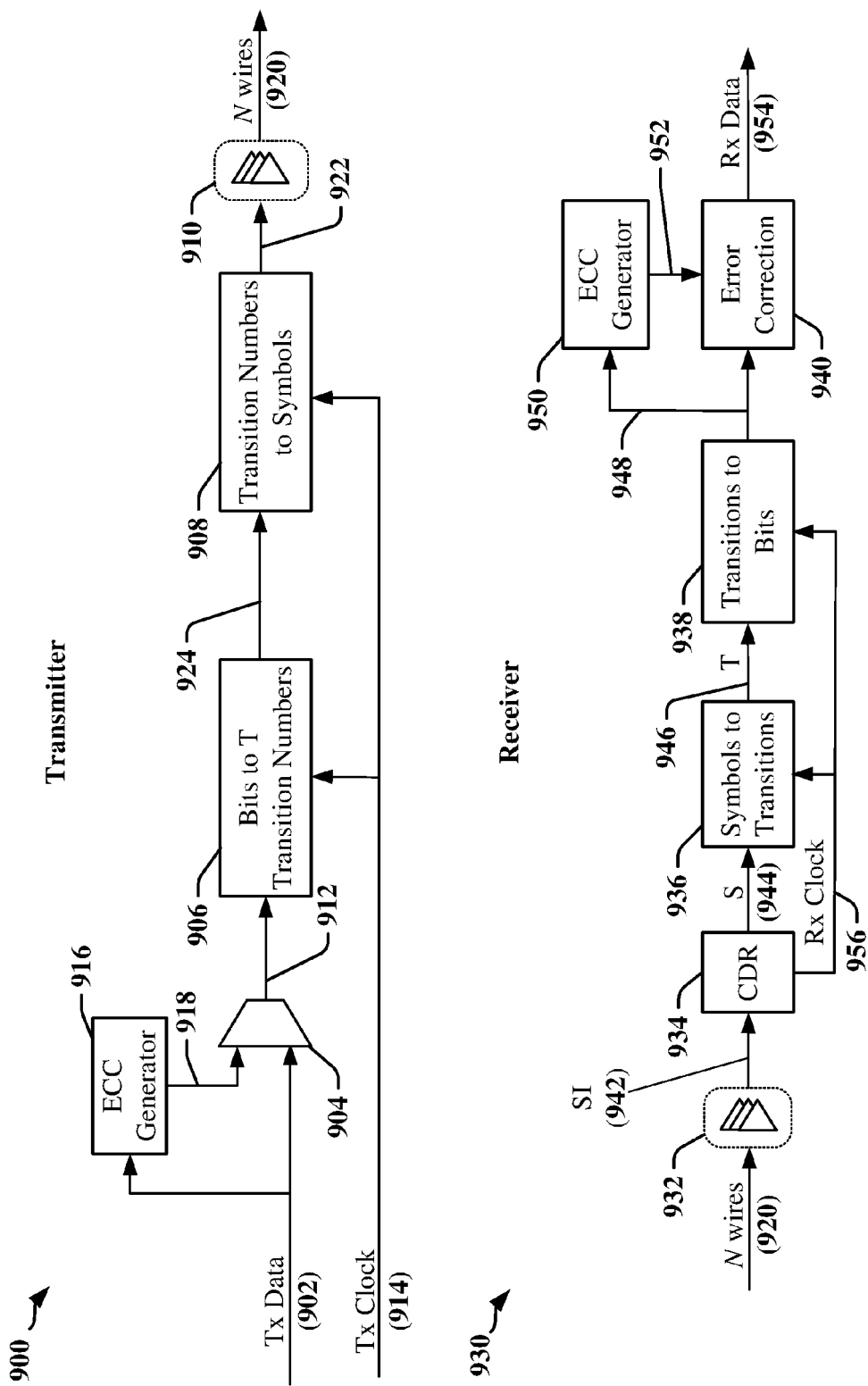
FIG. 9 illustrates conventional error correction in a multi-wire interface in which clock information is embedded in a sequence of symbols transmitted over N wires.

FIG. 9 provides a generalized illustration of the operation of a multi-wire interface in which clock information is embedded in a sequence of symbols transmitted over N wires 920. In a transmitter 900, an ECC generator 916 generates an EEC 918 from data bits 902 to be transmitted (also referred to as the data payload or transmission data 902) on a multi-wire interface. The transmission data 902 may be organized as a packet, one or more words and/or some other configuration of bits. In one example, the transmission data 902 may include a fixed number of bits provided according to a MIPI standard.

The ECC 918 may be generated using any suitable algorithm or technique that may be used for forward error correction (FEC). FEC permits a receiver 930 to correct certain transmission errors that may affect one or more bits of a symbol transmitted on the N wires 920. Transmission errors may occur due to noise or crosstalk, other electromagnetic interference, and so on. The transmitter 900 may include a module or circuit 904 that appends an ECC 918 to the transmission data 902 to obtain a data packet 912. The data packet 912 may be transcoded to obtain a sequence of symbols that encodes the transmission data 902, the ECC 918 and clock information related to a transmit clock 914. In one example, the transmitter 900 may include a first converter 906 that converts the data packet to transition numbers 924, and a second converter 908 that converts the transition numbers 924 to a sequence of symbols 922 that may be transmitted over the N wires 920 using the line drivers 910.

At the receiver 930, a CDR 934 is provided to extract symbols 944 and a receive clock 956 from sequences of raw symbols 942 in signals received from the N wires 920 using line receivers 932. A first converter 936 may convert the sequence of symbols 944 to transition numbers 946. The transition numbers 946 are converted by a second converter 938 to provide a received data packet 948. The received data packet 948 is provided to an ECC generation circuit or module 950 that generates a receiver ECC 952 from data bits in the received data packet 948. An error detection and/or correction circuit or module 950 may compare the receiver ECC 952 to ECC bits in the received packet ECC 948 that correspond to the ECC 918 generated by the ECC generator 916 in the transmitter 900. The error correction circuit 940 may attempt to use the ECCs 918 and 952 to correct errors in the received packet ECC 948 in order to generate a reliable copy of transmission data 902 to be output as received data 954.

A Hamming code may be used to configure the ECC generators 916 and 950. The Hamming code is used to provide a block parity scheme that can correct at least a single bit error, and reliably detect two bit errors per transmitted data packet 912. A Hamming rule may be used to calculate the number of parity or error check bits in the ECC 918, 952 required to accurately detect two bit errors and to allow a single bit error to be corrected. The Hamming rule may be expressed as:

$$d+p+1 \le 2^p, \text{ where}$$

d is the number of bits in the transmission data 902, and
p is the number of bits in the ECC 918, 952.

In the example shown in FIG. 9, transmission errors exhibited as one or more errors in the received symbols 942 may not have a direct correlation with a corresponding number of affected bits in the received data packet 948, when the transmitter 900 embeds clock information 914 with transmission data 902 in transmitted the sequences of symbols 922. In some instances, a single symbol error occurring on an N! or CCIe multiple-symbol word can cause multiple bit errors after reverse transcoding. For example, the table 1000 in FIG. 10 illustrates the effect of single symbol errors in a CCIe system that uses an encoding scheme similar to that illustrated in FIG. 9. The first row 1002 of the table illustrates an error free transmission and decoding of a 12-symbol sequence $S_{11} \ldots S_0 = \{0, 3, 2, 1, 0, 3, 2, 1, 0, 3, 2, 1\}$, which encodes a 20-bit binary number having all bits set to logic '0' (value=0). The remaining rows illustrate the effects of an erroneous received symbol 1004 (circled) on the transition numbers 1006, and resultant errors in decoded hexadecimal values 1008 and corresponding decoded bits 1010. It can be seen from the table 1000 that a single transmission error can result in multiple bit errors that can defeat an error correction scheme that is based on an ECC 918 calculated directly from transmission data 902.

Certain aspects disclosed herein provide an error detection and/or correction scheme that can be more reliably used with N! interfaces, CCIe interfaces and other interfaces that embed clock information in sequences of symbols. For example, an ECC may be calculated from symbol values to be transmitted a multi-wire communication link. Accordingly, one or more symbol errors may be corrected at the receiver using the ECC.

Figure 11:
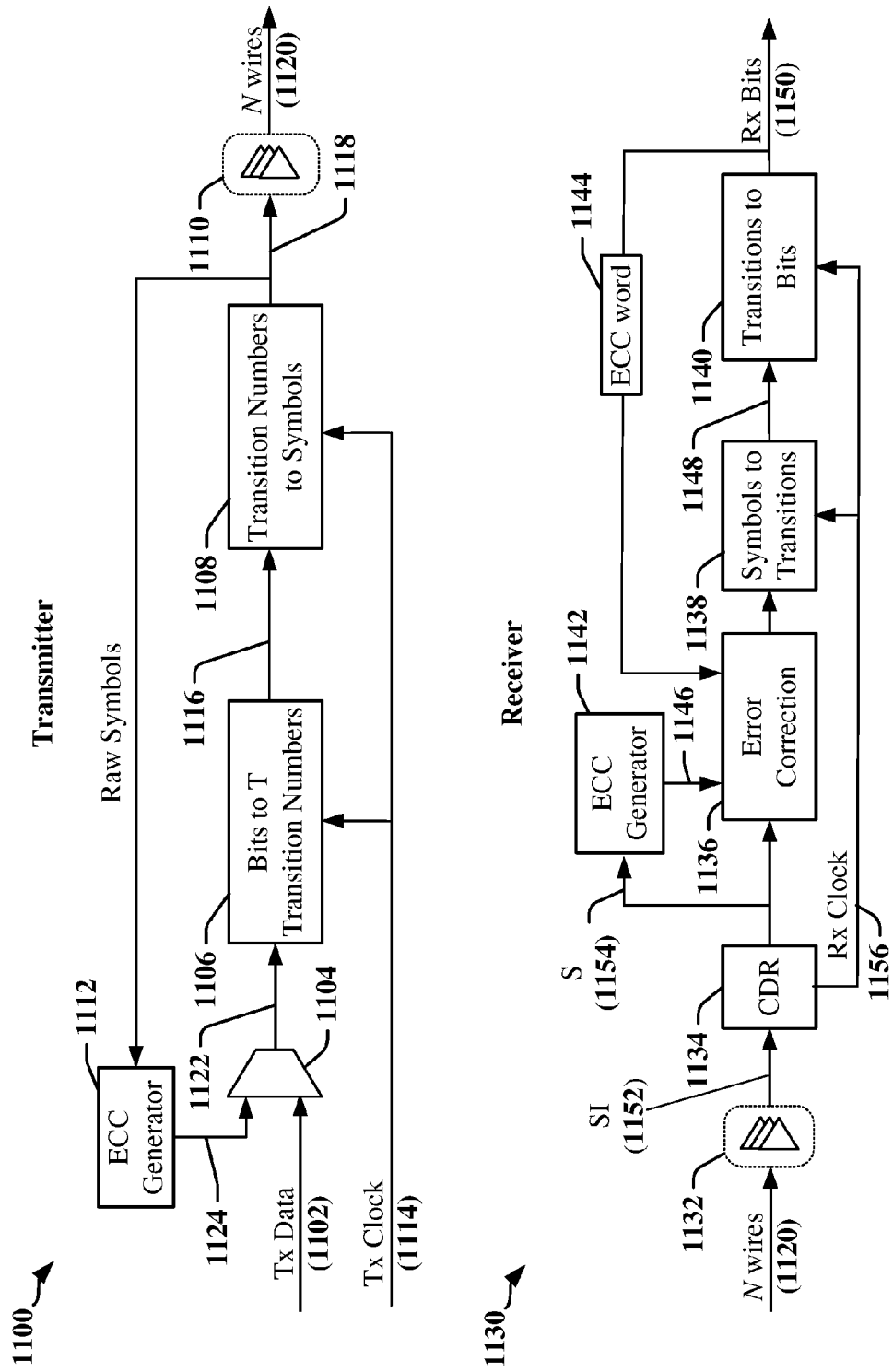
FIG. 11 illustrates a generalized forward error correction scheme according to one or more aspects disclosed herein, where the forward error correction scheme may be used in a multi-wire interface that embeds clock information in transmitted symbols.

FIG. 11 illustrates a generalized example of an FEC scheme used in a multi-wire interface that embeds clock information related to a transmit clock 1114 in transmitted symbols 1118.

A transmitter 1100 includes combining logic 1104 that is configured to append ECC bits 1124 to transmission data 1102 to obtain a transmission data packet 1122. A first converter 1106 converts the transmission data packet 1122 to transition numbers 1116, which are converted to a sequence of symbols 1118 by a second converter 1108. The sequence of symbols 1118 is transmitted on the N wires 1120 using suitably configured line drivers 1110. An ECC generation circuit 1112 generates the ECC bits 1124 based on the values in the sequence of symbols 1118 that encode the transmission data 1102. The ECC bits 1124 appended to the transmission data packet 1122 are encoded in symbols, which are transmitted in the sequence of symbols 1118 on the N wires 1120.

At the receiver 1130, a CDR 1134 is provided to extract symbols 1154 and a receive clock 1156 from sequences of raw symbols 1152 received from the N wires 1120 using line receivers 1132. The extracted symbols 1154 are provided to ECC generation logic 1142 and error correction logic 1136. The ECC generation logic 1142 generates a receiver ECC 1146 from the received symbols 1154. The error correction logic 1136 may compare the receiver ECC 1146 with an ECC word 1144 decoded from the received symbols 1154. Accordingly, the error correction logic 1136 may detect and/or correct errors in the received symbols 1154. A first converter 1138 may generate transition numbers 1148 from corrected symbols received from the error correction logic 1136. These transition numbers 1148 may then be converted by a second converter 1140 to provide received data 1150.

Figure 12:
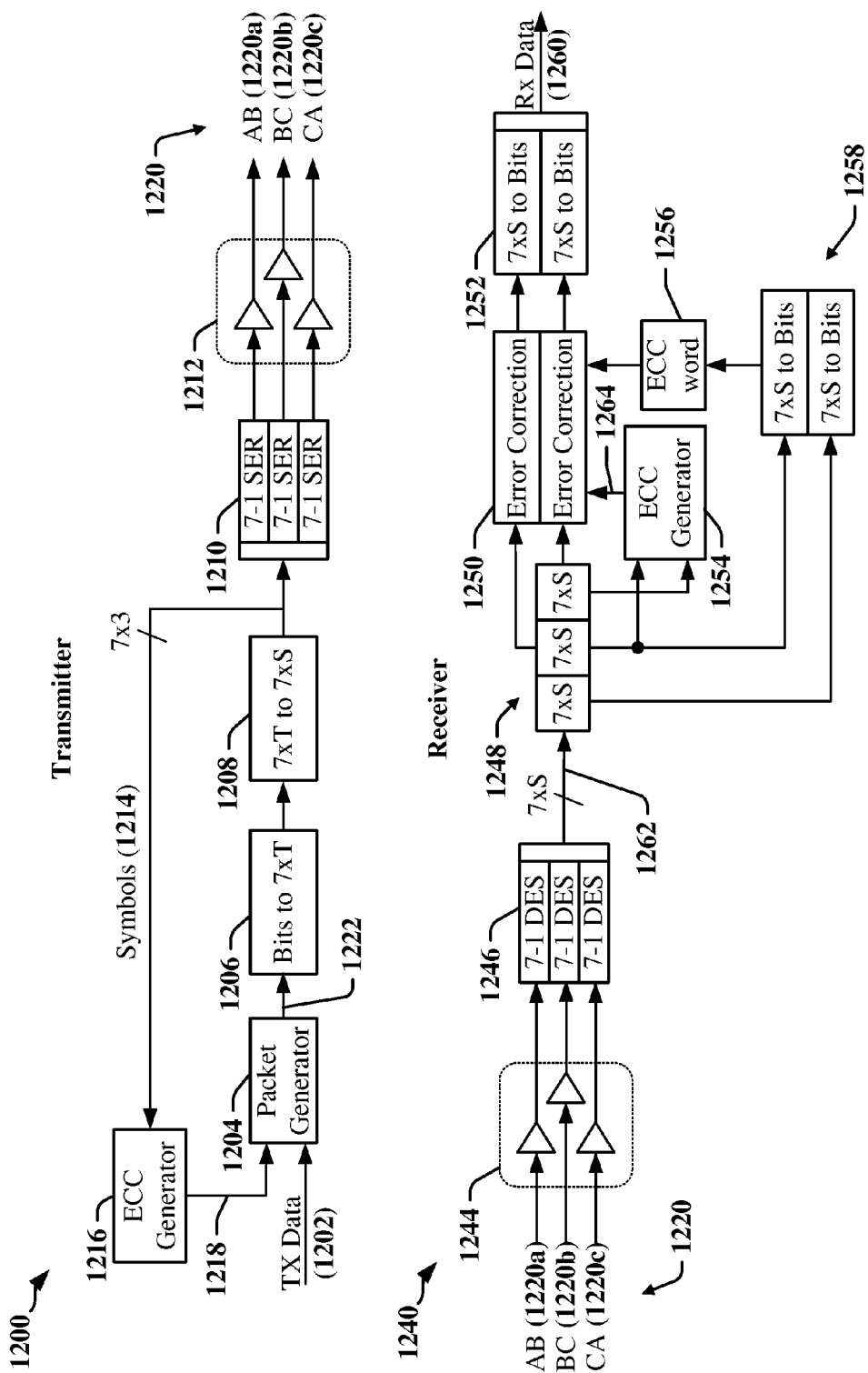
FIG. 12 illustrates an example of a forward error correction scheme used in an N! interface in accordance with one or more aspects disclosed herein.

FIG. 12 illustrates an example of an FEC scheme that may be employed in an N! interface. In this example, a 3! interface is provided whereby a transmitter 1200 is configured to use a set of three differential line drivers 1212 to drive different pairs 1220a, 1220b, 1220c of the wires in a 3-wire link 1220. The transmitter 1200 includes a packet generator 1204 that forms a transmitter data packet 1222 by appending ECC information 1218 to transmission data 1202. Transcoding circuits 1206, 1208 convert the transmitter data packet 1222 to a sequence of symbols 1214 for transmission on the 3! interface. In the example, each of three serializers 1210 is configured to serialize one bit of the three bit symbols 1214. The outputs of the serializers 1210 are provided to the differential line drivers 1212, each of which drives one pair 1220a, 1220b, 1220c of the three wires in the 3! interface 1220.

Figure 13:
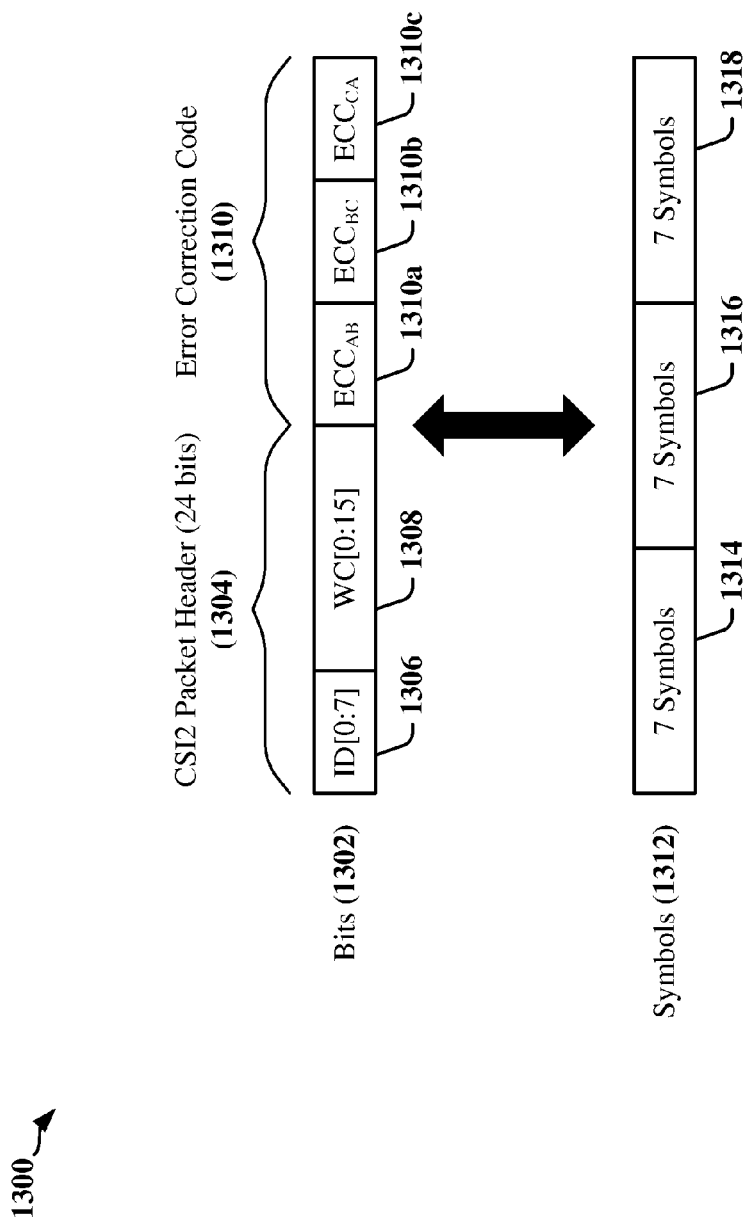
FIG. 13 illustrates an example of a camera serial interface packet header to which ECC information is appended.

The ECC generator 1216 calculates the ECC information 1218 from the sequence of symbols 1214. The number of bits used to encode the ECC information 1218 may be calculated according to the Hamming rule, $d+p+1 \le 2^p$. FIG. 13 illustrates one example in which ECC information 1310 is appended to a 24-bit camera serial interface (CSI2) packet header 1304. Here the CSI2 packet header 1304 is d=24 bits in length. Accordingly, $p+25 \le 2^p$ to permit 1 bit error correction and two-bit error detection, and any value of $p \ge 5$ satisfies the Hamming rule. ECC information 1218 for each pair of wires 1220 may be transmitted in three 8-bit words, for a total of 24 bits.

In this latter example, the ECC information 1310 includes an ECC 1310a, 1310b, 1310c calculated for each differential signal transmitted on the 3! interface. For example, the 3 wires may be labeled A, B and C and three differential signals 1220a, 1220b and 1220c may be transmitted over the available pairs AB, BC and CA, respectively. In this example, each of the ECCs 1310a, 1310b, 1310c has a length of 8 bits. The 24-bit CSI2 packet header 1304 and the ECC information 1310 may be transmitted in three sequences of 7 symbols 1314, 1316 and 1318.

The receiver 1240 may receive the three sequences of symbols 1314, 1316 and 1318 using differential receivers 1244. A set of three deserializers 1246 provides a set of 7 symbols 1262 corresponding to each of the three sequences of symbols 1314, 1316 and 1318. The receiver 1240 may process each of three sets of 7 symbols 1248 to extract transmitter ECC 1218 and may independently generate receiver ECC information 1264. Accordingly, an ECC generator 1254 may be configured to generate the receiver ECC information 1264 from the symbols that encode the CSI2 packet header 1304, which may be found in two of the three sets of 7 symbols 1248. Concurrently, the symbols that carry the ECC code information 1310 are decoded to obtain the a decoded ECC 1256 corresponding to the transmitter ECC information 1218. The symbols carrying the ECC code information 1310 may be found in two of the three sets of 7 symbols 1248. Error correction logic 1250 may be configured to compare the receiver ECC information 1264 to the decoded transmitter ECC information 1256, and to identify and/or correct bit errors in the two of the three sets of 7 symbols 1248 that encode the CSI2 packet header 1304. The output of the error correction logic 1250 is provided as receiver output data 1260.

Figure 14:
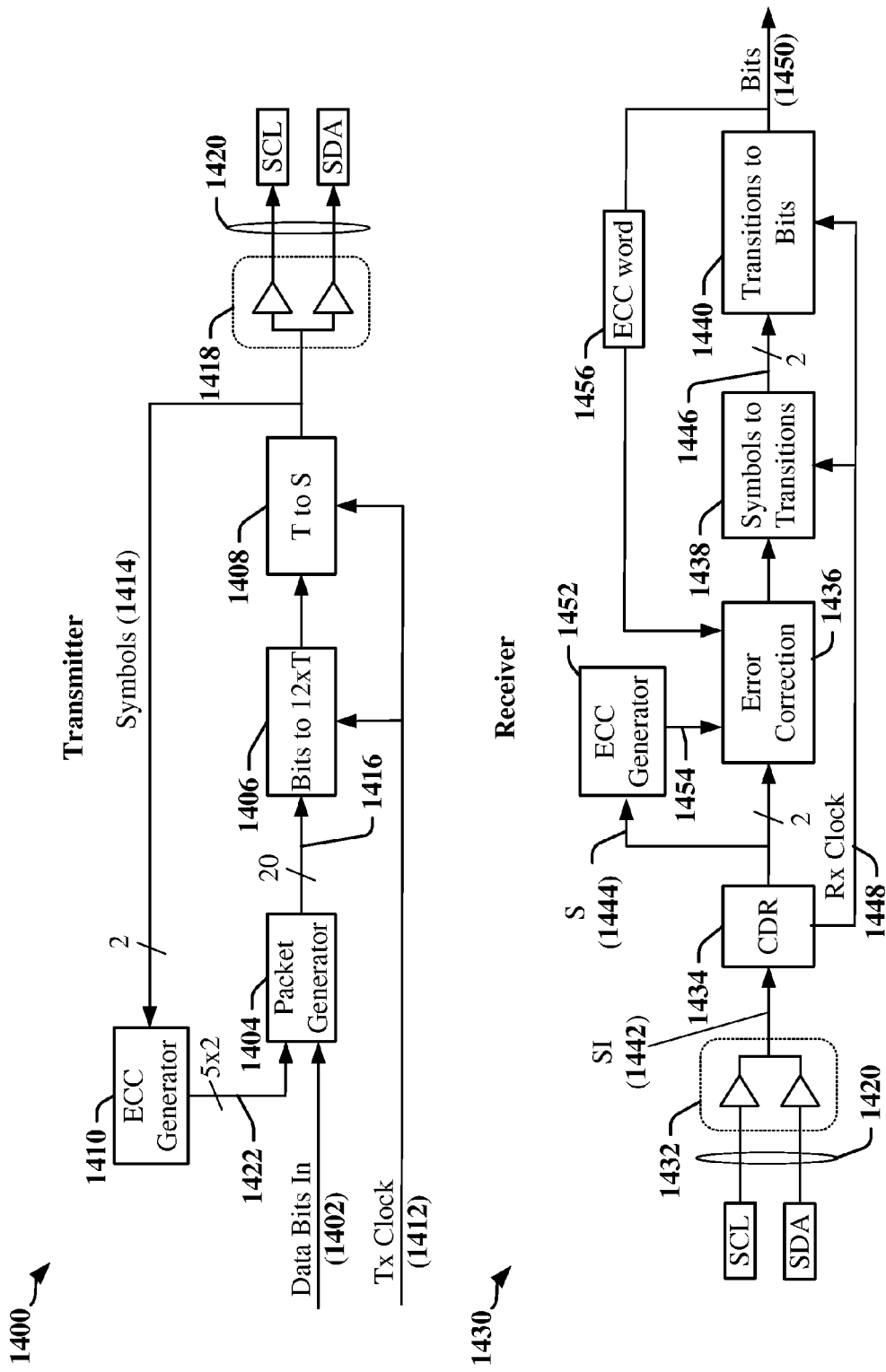
FIG. 14 illustrates an example of an error correction scheme that may be employed in a CCIe interface in accordance with one or more aspects disclosed herein.

FIG. 14 is a drawing illustrating an example of an error correction scheme that may be employed in a CCIe interface. In this example, a transmitter 1400 is configured to transmit 2-bit symbols in signals transmitted by a pair of line drivers 1418 over a pair of wires 1420. The transmitter 1400 includes a packet generator 1404 that forms a transmitter data packet 1416 by appending ECC information 1422 to transmission data 1402. Transcoding circuits 1406, 1408 convert the transmitter data packet 1416 to a sequence of symbols 1414 for transmission on the two wires 1420.

The ECC generator 1410 calculates the ECC information 1422 from the sequence of symbols 1414. The number of bits used to encode the ECC information 1422 may be calculated according to the Hamming rule, $d+p+1 \le 2^p$. In one example, the ECC information 1422 is calculated for a single 12-bit CCIe word and, consequently, $p+13 \le 2^p$ to permit 1 bit error correction and two-bit error detection, and any value of $p \ge 5$ satisfies the Hamming rule. In another example, the ECC information 1422 is calculated for two 12-bit CCIe words, $p+25 \le 2^p$ to permit 1 bit error correction and two-bit error detection and, again, any value of $p \ge 5$ satisfies the Hamming rule. Accordingly, it may be more efficient to add ECC information to two-word transmissions than to single-word transmissions.

The receiver 1430 may receive symbols 1414 from the pair of wires 1420 using receivers 1432. A CDR 1434 may provide a receive clock 1448 and a sequence of symbols 1444 from the raw symbols 1442 received by the line receivers 1432. The sequence of symbols 1444 is provided to error correction logic 1436 and an ECC generator 1452. The error correction logic 1436 may compare an ECC provided by the ECC generator 1452 with a version 1456 of the transmitter ECC 1422 that is decoded from the sequence of symbols 1444. Based on this comparison, the error correction logic 1436 may identify and/or correct bit errors in the sequence of symbols 1444. The output of the error correction logic 1436 may be provided to the transcoder logic 1438, 1440 to produce receiver output data 1450.

Figure 15:
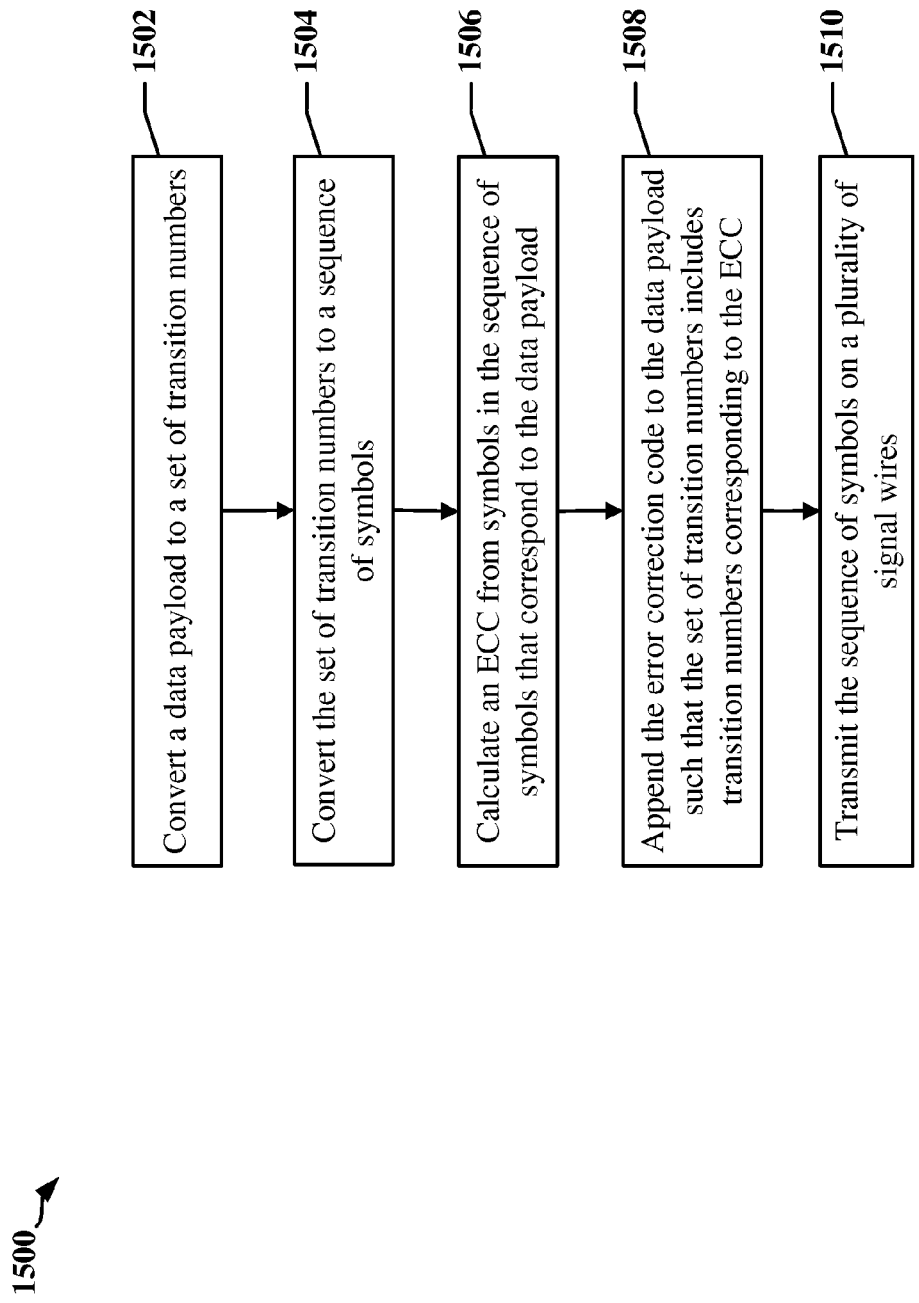
FIG. 15 is a flowchart illustrating a method for data communications implemented in a transmitter on an N-wire communications link.

FIG. 15 is a flowchart 1500 illustrating a method for data communications on an N-wire communications link. The communications link may include a plurality of connectors that carry symbols encoded using a suitable encoding scheme, such as N! encoding, CCIe encoding, multiphase encoding, multi-wire differential encoding, etc. The connectors may include electrically conductive wires, optical signal conductors, semi-conductive interconnects and so on. The method may be performed by one or more processors of a transmitting device.

At step 1502, a data payload is converted to a set of transition numbers.

At step 1504, the set of transition numbers is converted to a sequence of symbols. The set of transition numbers may be converted to the sequence of symbols by using a transition number to select a next symbol relative to a current symbol. A value of the transition number may represent a separation between the current symbol and the next symbol in a table of available symbols.

At step 1506, an ECC is calculated from symbols in the sequence of symbols that correspond to the data payload.

At step 1508, the ECC is appended to the data payload such that the set of transition numbers includes transition numbers corresponding to the ECC.

In accordance with certain aspects disclosed herein, an error correction code may be calculated for each of a plurality of signals transmitted on the plurality of signal wires. The plurality of signals may correspond to the sequence of symbols. The error correction codes calculated for the plurality of signals may be appended to the data payload. Each of the plurality of signals may correspond to a bit in each symbol in the sequence of symbols.

In accordance with certain aspects disclosed herein, ECCs calculated for different bits in a symbol and/or calculated for a plurality signals that are encoded with the sequence of symbols may be used to correct multiple errors in the sequence of symbols. For example, a plurality of ECCs can be used to correct multiple errors occurring in a sequence of symbols when two or more signals corresponding to different bits of the symbols each have a single error.

At step 1510, the sequence of symbols is transmitted on a plurality of signal wires. In one example, the plurality of signal wires may be provided in a CCIe bus and the data payload may include two CCIe words. In another example, the sequence of symbols may be transmitted by transmitting each symbol in the sequence of symbols on differential signals carried on different combinations of two signal wires selected from the plurality of signal wires. Each of the differential signals may correspond to a bit of the each symbol and an error correction code may be calculated for each differential signal.

In accordance with certain aspects disclosed herein, clock information may be encoded in the sequence of symbols. The clock information may be encoded by ensuring that each pair of consecutive symbols in the sequence of symbols includes two symbols that produce different signaling states on the plurality of signal wires.

Figure 16:
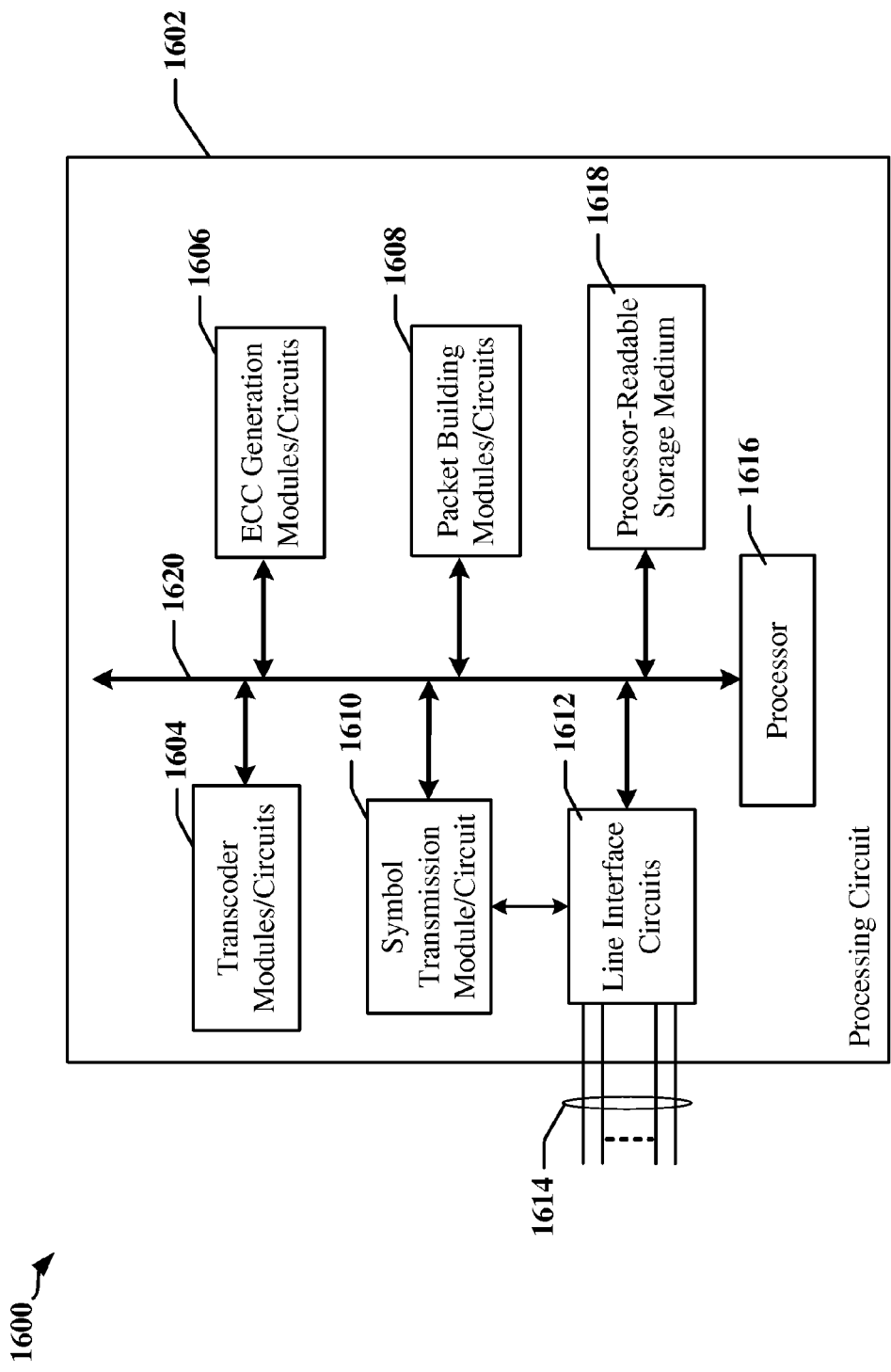
FIG. 16 is a diagram illustrating a simplified example of a hardware implementation for a transmitting apparatus.

FIG. 16 is a diagram illustrating a simplified example of a hardware implementation for an apparatus 1600 employing a processing circuit 1602. The processing circuit typically has a processor 1616 that may include one or more of a microprocessor, microcontroller, digital signal processor, a sequencer and a state machine. The processing circuit 1602 may be implemented with a bus architecture, represented generally by the bus 1620. The bus 1620 may include any number of interconnecting buses and bridges depending on the specific application of the processing circuit 1602 and the overall design constraints. The bus 1620 links together various circuits including one or more processors and/or hardware modules, represented by the processor 1616, the modules or circuits 1604, 1606, 1608 and 1610, line interface circuits 1612 configurable to communicate over connectors or wires 1614 and the computer-readable storage medium 1618. The bus 1620 may also link various other circuits such as timing sources, peripherals, voltage regulators, and power management circuits, which are well known in the art, and therefore, will not be described any further.

The processor 1616 is responsible for general processing, including the execution of software stored on the computer-readable storage medium 1618. The software, when executed by the processor 1616, causes the processing circuit 1602 to perform the various functions described supra for any particular apparatus. The computer-readable storage medium 1618 may also be used for storing data that is manipulated by the processor 1616 when executing software, including data decoded from symbols transmitted over the connectors 1614. The processing circuit 1602 further includes at least one of the modules 1604, 1606, 1608 and 1610. The modules 1604, 1606, 1608 and 1610 may be software modules running in the processor 1616, resident/stored in the computer-readable storage medium 1618, one or more hardware modules coupled to the processor 1616, or some combination thereof. The modules 1604, 1606, 1608 and/or 1610 may include microcontroller instructions, state machine configuration parameters, or some combination thereof.

In one configuration, the apparatus 1600 for wireless communication includes modules and/or circuits 1604 configured to convert a data payload to a set of transition numbers, and further configured to convert the set of transition numbers to a sequence of symbols, modules and/or circuits 1606 configured to calculate an ECC from symbols in the sequence of symbols that correspond to the data payload, modules and/or circuits 1608 configured to append the ECC to the data payload such that the set of transition numbers includes transition numbers corresponding to the ECC, and modules and/or circuits 1610, 1612 configured to transmit the sequence of symbols on a plurality of signal wires 1614. In one example, the circuits illustrated in FIGS. 11, 12 and 14 provide logic which implement the various functions performed by the apparatus 1302.

Figure 17:
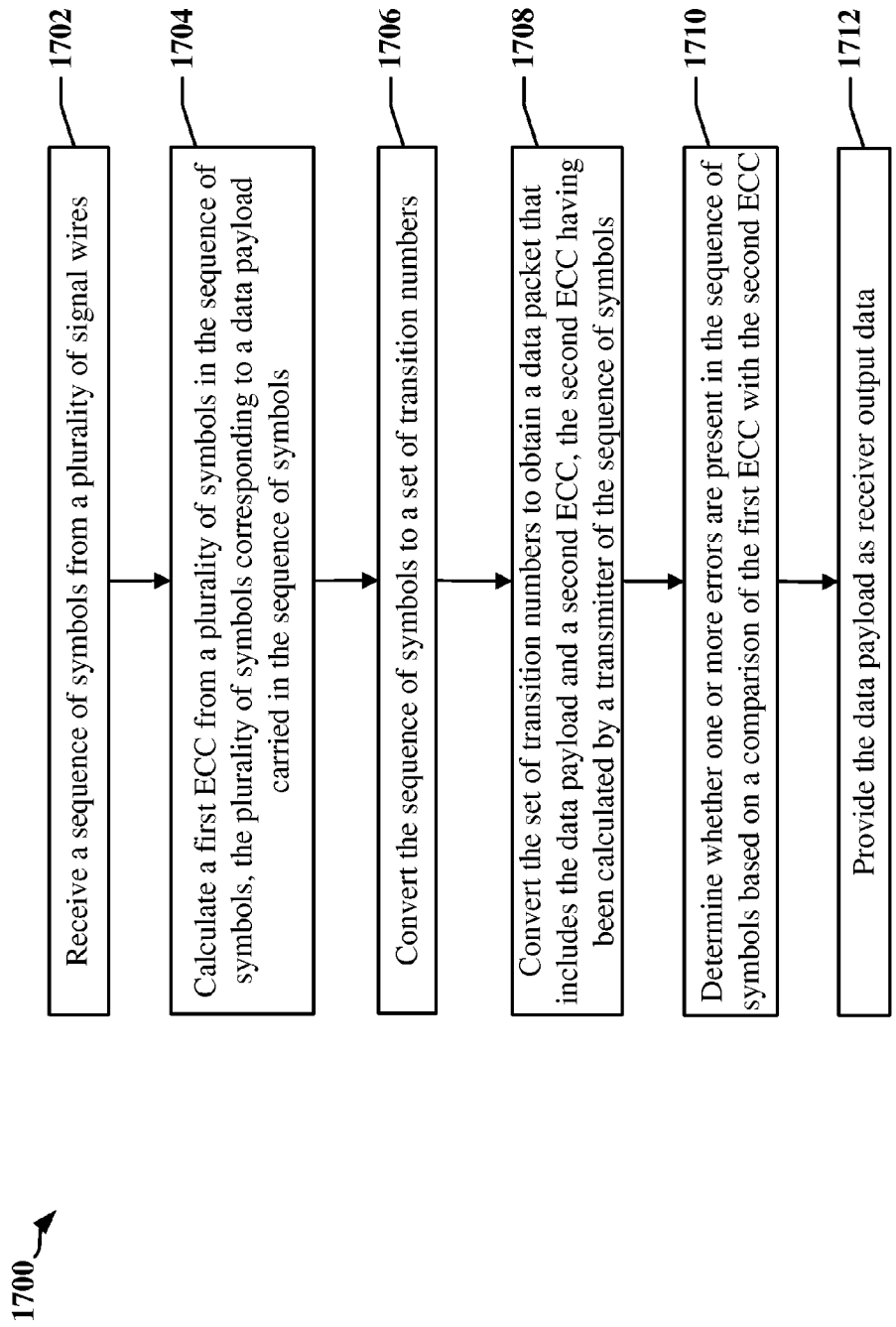
FIG. 17 is a flowchart illustrating a method for data communications implemented in a receiver on an N-wire communications link.

FIG. 16 is a diagram 1600 illustrating a simplified example of a hardware implementation for an apparatus FIG. 17 is a flowchart 1700 illustrating a method for data communications on an N-wire communications link. The communications link may include a plurality of connectors that carry symbols encoded using a suitable encoding scheme, such as N! encoding, multiphase encoding, multi-wire differential encoding, etc. The connectors may include electrically conductive wires, optical signal conductors, semi-conductive interconnects and so on. The method may be performed by one or more processors of a receiving device.

At step 1702, a sequence of symbols is received from a plurality of signal wires. The plurality of signal wires may be provided in a CCIe bus in one example, and in an N! interface in another example.

At step 1704, a first ECC is calculated from a plurality of symbols in the sequence of symbols. Each symbol in the sequence of symbols may be received as a set of differential signals carried on different combinations of two signal wires selected from the plurality of signal wires. Each differential signal in the set of differential signals may correspond to a bit of the each symbol. The first ECC may be calculated by calculating an ECC for each differential signal. The plurality of symbols may correspond to a data payload carried in the sequence of symbols. The data payload may include two CCIe words.

At step 1706, the sequence of symbols may be converted to a set of transition numbers. The sequence of symbols may be converted to the set of transition numbers by deriving a transition number as a value that represents a separation between occurrences of a current symbol and an immediately preceding symbol in a table of available symbols.

At step 1708, the set of transition numbers may be converted to obtain a data packet that includes the data payload and a second ECC. The second ECC may have been calculated by a transmitter of the sequence of symbols.

At step 1710, it may be determined whether one or more errors are present in the sequence of symbols based on a comparison of the first ECC with the second ECC. Based on the determination, at least one error in the sequence of symbols may be corrected using the first ECC and the second ECC.

At step 1712, the payload data as receiver output data.

In accordance with certain aspects disclosed herein, a receive clock is extracted from the sequence of symbols. Clock information may be embedded in changes in signaling state associated with symbols in the sequence of symbols. Each pair of consecutive symbols in the sequence of symbols may include two symbols that are associated with different signaling states on the plurality of signal wires.

In accordance with certain aspects disclosed herein, a plurality of first error correction codes may be calculated from the sequence of symbols. Each error correction code may correspond to a bit in each symbol of the sequence of symbols. It may be determined whether one or more errors are present in the sequence of symbols by comparing each of the plurality of first error correction codes with corresponding second error correction codes appended to the data packet. Errors in individual signals of a plurality of signals may be detected or corrected based on the comparison of the first error correction codes with corresponding second error correction codes.

Figure 18:
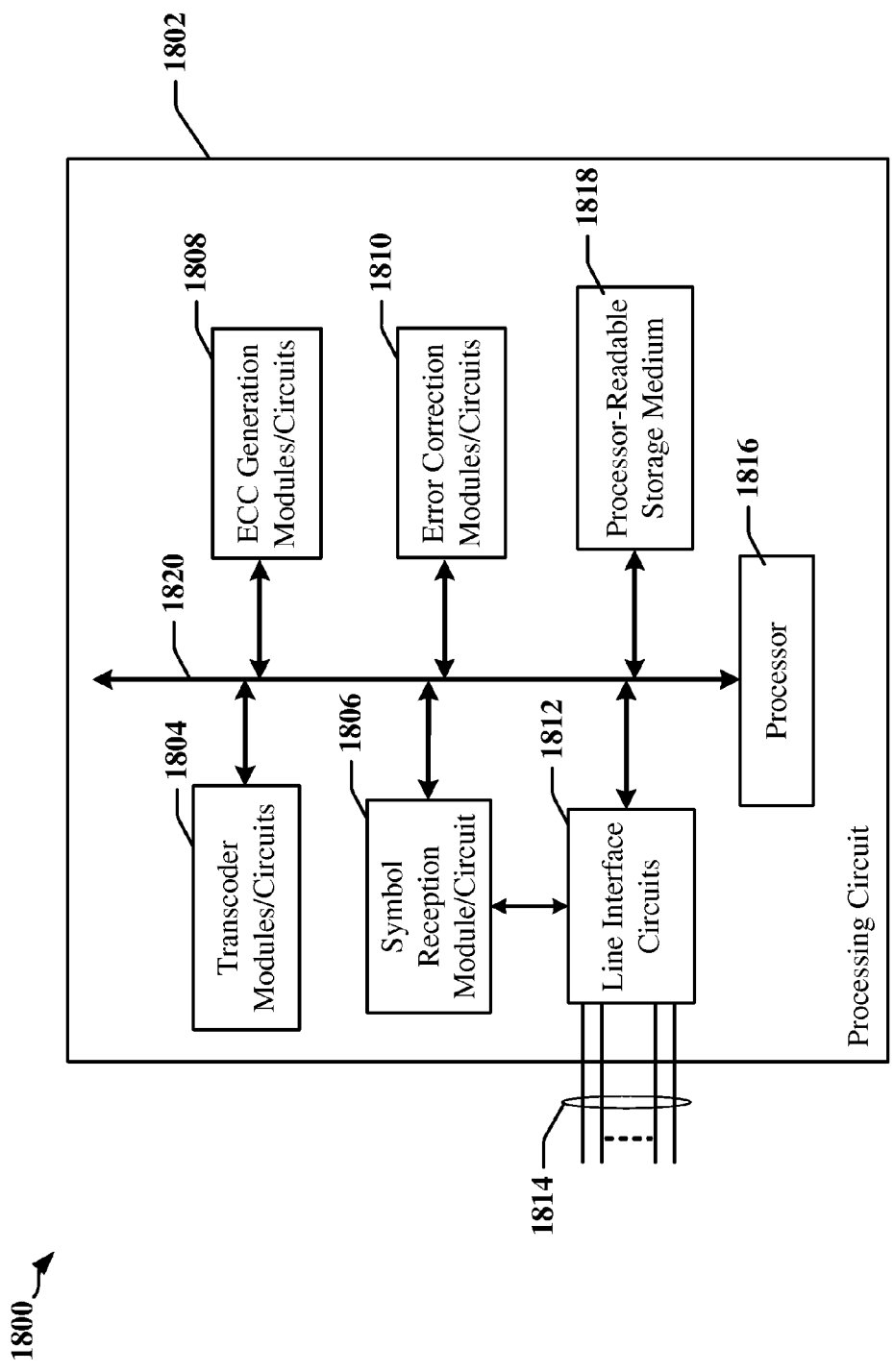
FIG. 18 is a diagram illustrating a simplified example of a hardware implementation for a receiving apparatus on an N-wire communications link.

FIG. 18 is a diagram illustrating a simplified example of a hardware implementation for an apparatus 1800 employing a processing circuit 1802. The processing circuit typically has a processor 1816 that may include one or more of a microprocessor, microcontroller, digital signal processor, a sequencer and a state machine. The processing circuit 1802 may be implemented with a bus architecture, represented generally by the bus 1820. The bus 1820 may include any number of interconnecting buses and bridges depending on the specific application of the processing circuit 1802 and the overall design constraints. The bus 1820 links together various circuits including one or more processors and/or hardware modules, represented by the processor 1816, the modules or circuits 1804, 1806 and 1808, line interface circuits 1812 configurable to communicate over connectors or wires 1814 and the computer-readable storage medium 1818. The bus 1820 may also link various other circuits such as timing sources, peripherals, voltage regulators, and power management circuits, which are well known in the art, and therefore, will not be described any further.

The processor 1816 is responsible for general processing, including the execution of software stored on the computer-readable storage medium 1818. The software, when executed by the processor 1816, causes the processing circuit 1802 to perform the various functions described supra for any particular apparatus. The computer-readable storage medium 1818 may also be used for storing data that is manipulated by the processor 1816 when executing software, including data decoded from symbols transmitted over the connectors 1814. The processing circuit 1802 further includes at least one of the modules 1804, 1806, 1808 and 1810. The modules 1804, 1806, 1808 and 1810 may be software modules running in the processor 1816, resident/stored in the computer-readable storage medium 1818, one or more hardware modules coupled to the processor 1816, or some combination thereof. The modules 1804, 1806, 1808 and 1810 may include microcontroller instructions, state machine configuration parameters, or some combination thereof.

In one configuration, the apparatus 1800 for wireless communication includes modules and/or circuits 1806, 1812 configured to receive a sequence of symbols from a plurality of signal wires 1814, modules and/or circuits 1808 configured to calculate a first ECC from a plurality of symbols in the sequence of symbols, the plurality of symbols corresponding to a data payload carried in the sequence of symbols, modules and/or circuits 1804 configured to convert the sequence of symbols to a set of transition numbers and further configured to convert the set of transition numbers to obtain a data packet that includes the data payload and a second ECC, modules and/or circuits 1808 configured to determine whether one or more errors are present in the sequence of symbols based on a comparison of the first ECC with the second error correction code, and modules and/or circuits 1804, 1808 configured to provide the data payload as receiver output data. In one example, the circuits illustrated in FIGS. 11, 12 and provide logic which implement the various functions performed by the apparatus 1802.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method of data communications, comprising:
   converting a data payload to a set of transition numbers;
   converting the set of transition numbers to a sequence of symbols;
   calculating an error correction code from symbols in the sequence of symbols that correspond to the data payload;
   appending the error correction code to the data payload such that the set of transition numbers includes transition numbers corresponding to the error correction code; and
   transmitting the sequence of symbols on a plurality of signal wires.

2. The method of claim 1, wherein converting the set of transition numbers to the sequence of symbols comprises:

using a transition number to select a next symbol relative to a current symbol, wherein a value of the transition number represents a separation between the current symbol and the next symbol in a table of available symbols.

3. The method of claim 1, further comprising:
encoding clock information in the sequence of symbols, wherein the clock information is encoded by ensuring that each pair of consecutive symbols in the sequence of symbols includes two symbols that produce different signaling states on the plurality of signal wires.

4. The method of claim 1, wherein calculating the error correction code comprises:
calculating an error correction code for each of a plurality of signals transmitted on the plurality of signal wires, wherein the plurality of signals corresponds to the sequence of symbols; and
append the error correction code for the each of the plurality of signals to the data payload.

5. The method of claim 4, wherein each of the plurality of signals corresponds to a bit in each symbol in the sequence of symbols.

6. The method of claim 1, wherein the plurality of signal wires is provided in a camera control interface CCI extension (CCIe) bus.

7. The method of claim 6, wherein the data payload includes two CCIe words.

8. The method of claim 1, wherein transmitting the sequence of symbols comprises:
transmitting each symbol in the sequence of symbols on differential signals carried on different combinations of two signal wires selected from the plurality of signal wires.

9. The method of claim 8, wherein each of the differential signals corresponds to a bit of the each symbol, and wherein calculating the error correction code comprises:
calculating an error correction code for each differential signal,
wherein a plurality of error correction codes is appended to the data payload such that the set of transition numbers includes transition numbers corresponding to the plurality of error correction codes.

10. An apparatus, comprising:
means for converting a data payload to a set of transition numbers;
means for converting the set of transition numbers to a sequence of symbols;
means for calculating an error correction code from symbols in the sequence of symbols that correspond to the data payload;
means for appending the error correction code to the data payload such that the set of transition numbers includes transition numbers corresponding to the error correction code; and
means for transmitting the sequence of symbols on a plurality of signal wires.

11. A transmitter, comprising:
a plurality of line drivers configured to transmit a plurality of signals on an N wire interface; and
a processing circuit configured to:
convert a data payload to a set of transition numbers;
convert the set of transition numbers to a sequence of symbols;
calculate an error correction code from symbols in the sequence of symbols that correspond to the data payload;
append the error correction code to the data payload such that the set of transition numbers includes transition numbers corresponding to the error correction code; and
transmit the sequence of symbols on a plurality of signal wires.

12. The transmitter of claim 11, wherein the processing circuit is configured to convert the set of transition numbers to the sequence of symbols by using a transition number to select a next symbol relative to a current symbol, wherein a value of the transition number represents a separation between the current symbol and the next symbol in a table of available symbols.

13. The transmitter of claim 11, wherein the processing circuit is configured to:
encode clock information in the sequence of symbols, wherein the clock information is encoded by ensuring that each pair of consecutive symbols in the sequence of symbols includes two symbols that produce different signaling states on the plurality of signal wires.

14. The transmitter of claim 11, wherein the processing circuit is configured to:
calculate an error correction code for each of a plurality of signals transmitted on the plurality of signal wires, wherein the plurality of signals corresponds to the sequence of symbols; and
append the error correction code for the each of the plurality of signals to the data payload.

15. The transmitter of claim 14, wherein each of the plurality of signals corresponds to a bit of each symbol in the sequence of symbols.

16. The transmitter of claim 11, wherein the plurality of signal wires is provided in a camera control interface CCI extension (CCIe) bus.

17. The transmitter of claim 11, wherein the processing circuit is configured to transmit the sequence of symbols by transmitting each symbol in the sequence of symbols on differential signals carried on different combinations of two signal wires selected from the plurality of signal wires.

18. The transmitter of claim 17, wherein each of the differential signals corresponds to a bit of the each symbol, and wherein the processing circuit is configured to:
calculate an error correction code for each differential signal,
wherein a plurality of error correction codes is appended to the data payload such that the set of transition numbers includes transition numbers corresponding to the plurality of error correction codes.

19. A non-transitory processor-readable storage medium having one or more instructions which, when executed by at least one processing circuit, cause the at least one processing circuit to:
convert a data payload to a set of transition numbers;
convert the set of transition numbers to a sequence of symbols;
calculate an error correction code from symbols in the sequence of symbols that correspond to the data payload;
append the error correction code to the data payload such that the set of transition numbers includes transition numbers corresponding to the error correction code; and
transmit the sequence of symbols on a plurality of signal wires.

20. A method of data communications, comprising:
receiving a sequence of symbols from a plurality of signal wires;

calculating a first error correction code from a plurality of symbols in the sequence of symbols, the plurality of symbols corresponding to a data payload carried in the sequence of symbols;

converting the sequence of symbols to a set of transition numbers;

converting the set of transition numbers to obtain a data packet that includes the data payload and a second error correction code, the second error correction code having been calculated by a transmitter of the sequence of symbols;

determining whether one or more errors are present in the sequence of symbols based on a comparison of the first error correction code with the second error correction code; and providing the data payload as receiver output data.

21. The method of claim 20, and further comprising:
correcting at least one error in the sequence of symbols using the first error correction code and the second error correction code.

22. The method of claim 20, wherein converting the sequence of symbols to the set of transition numbers comprises:
deriving a transition number as a value that represents a separation between occurrences of a current symbol and an immediately preceding symbol in a table of available symbols.

23. The method of claim 20, further comprising:
extracting a receive clock from the sequence of symbols, wherein clock information is embedded in changes in signaling state associated with symbols in the sequence of symbols, wherein each pair of consecutive symbols in the sequence of symbols includes two symbols that are associated with different signaling states on the plurality of signal wires.

24. The method of claim 20, wherein calculating the first error correction code comprises:
calculating a plurality of first error correction codes from the sequence of symbols, wherein each error correction code corresponds to a bit in each symbol of the sequence of symbols.

25. The method of claim 24, wherein determining whether one or more errors are present in the sequence of symbols comprises:
comparing each of the plurality of first error correction codes with corresponding second error correction codes appended to the data packet.

26. The method of claim 20, wherein the plurality of signal wires is provided in a camera control interface CCI extension (CCIe) bus.

27. The method of claim 26, wherein the data payload includes two CCIe words.

28. The method of claim 20, wherein each symbol in the sequence of symbols is received as a set of differential signals carried on different combinations of two signal wires selected from the plurality of signal wires.

29. The method of claim 28, wherein each differential signals in the set of differential signals corresponds to a bit of the each symbol, and wherein calculating the first error correction code comprises:
calculating an error correction code for each differential signal.

30. An apparatus, comprising:
means for receiving a sequence of symbols from a plurality of signal wires; means for calculating a first error correction code from a plurality of symbols in the sequence of symbols, the plurality of symbols corresponding to a data payload carried in the sequence of symbols;

means for converting the sequence of symbols to a set of transition numbers;

means for converting the set of transition numbers to obtain a data packet that includes the data payload and a second error correction code, the second error correction code having been calculated by a transmitter of the sequence of symbols;

means for determining whether one or more errors are present in the sequence of symbols based on a comparison of the first error correction code with the second error correction code; and means for providing the data payload as receiver output data.

31. A receiver, comprising:
a processing circuit configured to:
receive a sequence of symbols from a plurality of signal wires;
calculate a first error correction code from a plurality of symbols in the sequence of symbols, the plurality of symbols corresponding to a data payload carried in the sequence of symbols;
convert the sequence of symbols to a set of transition numbers;
convert the set of transition numbers to obtain a data packet that includes the data payload and a second error correction code, the second error correction code having been calculated by a transmitter of the sequence of symbols;
determine whether one or more errors are present in the sequence of symbols based on a comparison of the first error correction code with the second error correction code; and
provide the data payload as receiver output data.

32. The receiver of claim 31, wherein the processing circuit is configured to:
correct at least one error in the sequence of symbols using the first error correction code and the second error correction code.

33. The receiver of claim 31, wherein the processing circuit is configured to convert the sequence of symbols to the set of transition numbers by deriving a transition number as a value that represents a separation between occurrences of a current symbol and an immediately preceding symbol in a table of available symbols.

34. The receiver of claim 31, wherein the processing circuit is configured to:
extract a receive clock from the sequence of symbols, wherein clock information is embedded in changes in signaling state associated with symbols in the sequence of symbols, wherein each pair of consecutive symbols in the sequence of symbols includes two symbols that are associated with different signaling states on the plurality of signal wires.

35. The receiver of claim 31, wherein the processing circuit is configured to calculate the first error correction code by calculating a plurality of first error correction codes from the sequence of symbols, wherein each error correction code corresponds to a bit in each symbol of the sequence of symbols.

36. The receiver of claim 35, wherein the processing circuit is configured to determine whether one or more errors are present in the sequence of symbols by:
comparing each of the plurality of first error correction codes with corresponding second error correction codes appended to the data packet.

37. The receiver of claim 31, wherein the plurality of signal wires is provided in a camera control interface CCI extension (CCIe) bus.

38. The receiver of claim 31, wherein each symbol in the sequence of symbols is received as a set of differential signals carried on different combinations of two signal wires selected from the plurality of signal wires.

39. The receiver of claim 38, wherein each differential signals in the set of differential signals corresponds to a bit of the each symbol, and wherein the processing circuit is configured to calculating the first error correction code by calculating an error correction code for each differential signal.

40. A non-transitory processor-readable storage medium having one or more instructions which, when executed by at least one processing circuit, cause the at least one processing circuit to:

receive a sequence of symbols from a plurality of signal wires;

calculate a first error correction code from a plurality of symbols in the sequence of symbols, the plurality of symbols corresponding to a data payload carried in the sequence of symbols;

convert the sequence of symbols to a set of transition numbers;

convert the set of transition numbers to obtain a data packet that includes the data payload and a second error correction code, the second error correction code having been calculated by a transmitter of the sequence of symbols;

determine whether one or more errors are present in the sequence of symbols based on a comparison of the first error correction code with the second error correction code; and provide the data payload as receiver output data.

\* \* \* \* \*